US012766564B2

(12) United States Patent
Mitsuyoshi et al.

(10) Patent No.: US 12,766,564 B2
(45) Date of Patent: Oct. 20, 2026

(54) SUBSTRATE PROCESSING METHOD

(71) Applicant: SCREEN Holdings Co., Ltd., Kyoto (JP)

(72) Inventors: Ichiro Mitsuyoshi, Kyoto (JP); Tadashi Maegawa, Kyoto (JP); Hidehiko Ozaki, Kyoto (JP); Nozomu Nakagawa, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 20 days.

(21) Appl. No.: 19/047,752

(22) Filed: Feb. 7, 2025

(65) Prior Publication Data

US 2025/0256307 A1 Aug. 14, 2025

(30) Foreign Application Priority Data

Feb. 8, 2024 (JP) ................................ 2024-018108

(51) Int. Cl.

| | |
|---|---|
| ***B08B 3/04*** | (2006.01) |
| *B25J 11/00* | (2006.01) |
| *H10P 72/00* | (2026.01) |
| *H10P 72/30* | (2026.01) |

(52) U.S. Cl.

CPC ............. *B08B 3/04* (2013.01); *B25J 11/0095* (2013.01); *H10P 72/0416* (2026.01); *H10P 72/0426* (2026.01); *H10P 72/3211* (2026.01)

(58) Field of Classification Search

CPC .... B08B 3/04; B23J 11/0095; H10P 72/0416; H10P 72/3211; H10P 72/0426

See application file for complete search history.

(56) References Cited

U.S. PATENT DOCUMENTS

2005/0051195 A1 3/2005 Kamikawa
2010/0068014 A1 3/2010 Mitsuyoshi et al. ..... 414/225.01
2018/0090358 A1 3/2018 Miyamoto
2018/0090359 A1* 3/2018 Miyamoto ........... B65G 49/061
2025/0006535 A1* 1/2025 Iwasaki ............... H10P 72/0414
2025/0170619 A1* 5/2025 Taniguchi ............... B08B 3/041
(Continued)

FOREIGN PATENT DOCUMENTS

JP H05-175179 A 7/1993
KR 10-2010-0031458 A 3/2010
KR 10-2018-0035661 A 4/2018
(Continued)

*Primary Examiner* — Sharidan Carrillo
(74) *Attorney, Agent, or Firm* — OSTROLENK FABER LLP

(57) ABSTRACT

A substrate processing method including: a disassembly process of disassembling a temporary batch lot by dividing substrates into a first set and a second set such that two substrates facing each other among substrates constituting the temporary batch lot form different sets and moving the first set and the second set relative to each other in a direction orthogonal to an arrangement direction of the substrates; a half-rotation process of orienting the substrates constituting the second set in a direction opposite to the one direction by half-rotating the second set; and a rearrangement process of combining the first set and the second set to generate a batch lot such that the substrates oriented in the one direction and the substrates oriented in the opposite direction are alternately arranged.

7 Claims, 16 Drawing Sheets

(56) References Cited

U.S. PATENT DOCUMENTS

| | | | | |
|---|---|---|---|---|
| 2025/0256307 | A1* | 8/2025 | Mitsuyoshi | B08B 3/04 |
| 2025/0259875 | A1* | 8/2025 | Mitsuyoshi | H10P 50/283 |

FOREIGN PATENT DOCUMENTS

| | | | |
|---|---|---|---|
| KR | 10-2021-0050464 | A | 5/2021 |
| KR | 10-2023-0170584 | A | 12/2023 |
| TW | I378894 | B | 12/2012 |

* cited by examiner

SUBSTRATE PROCESSING METHOD

This application claims priority to Japanese Patent Application No. 2024-18108 filed Feb. 8, 2024, the subject matter of which is incorporated herein by reference in entirety.

BACKGROUND OF THE INVENTION

The present invention relates to a substrate processing method for a semiconductor substrate, a substrate for a flat panel display (FPD) such as a liquid crystal display or an organic electroluminescence (EL) display device, a glass substrate for a photomask, a substrate for an optical disk, and the like.

DESCRIPTION OF THE RELATED ART

JP H5-175179 A describes a substrate processing apparatus that takes out the same number of substrates from each of two carriers, forms a first substrate group and a second substrate group, inserts the second substrate group into a gap between the respective substrates of the first substrate group to convert the pitch to ½, forms a substrate group of twice the number of substrates, and collectively processes the substrates.

LIST OF DOCUMENTS

JP H5-175179 A

In recent years, there has been a demand for further improvement in efficiency of a substrate processing apparatus. In order to increase the number of substrates to be processed at one time by batch processing, it is necessary to further narrow the arrangement pitch of the substrates. A problem in this case is the orientation of the substrates. That is, for batch processing, it is more suitable from the viewpoint of preventing contamination of the device surface to form a batch lot by arranging substrates by a face-to-face method. In order to arrange the substrates by the face-to-face method with the device surfaces of the substrates facing each other, there is no choice but to combine the substrate arrangement acquired from a first carrier with the substrate arrangement acquired from a second carrier and rotated halfway. Therefore, according to the conventional configuration, although the arrangement pitch of the substrates can be halved, the arrangement pitch of the substrates cannot be further narrowed. When the substrates acquired from the second carrier are inserted into the gap of the substrate arrangement acquired from the first carrier to generate a batch lot, the arrangement pitch of the substrates in the batch lot is naturally determined to be half the original pitch.

The present invention has been made in view of such circumstances, and an object of the present invention is to provide a substrate processing method for efficiently performing substrate processing by narrowing an arrangement pitch of substrates.

SUMMARY OF THE INVENTION

In order to solve the above problems, the present invention has the following configurations.

In order to solve the above-described problem, the present invention has the following configuration.

That is, the present invention provides a substrate processing method for collectively processing a plurality of substrates having directions defined by a front surface and a back surface, the substrate processing method comprising:

a substrate group acquisition process of acquiring a substrate group in which substrates oriented in one direction are arranged at a predetermined interval;

a first assembly process of positioning a first substrate at a first position among the first position and a second position that divide the predetermined interval in the substrate group into three by combining a first arrangement in which the first substrate oriented in the one direction is arranged at the predetermined interval with the substrate group;

a second assembly process of forming a temporary batch lot by positioning a second substrate at the second position by combining a second arrangement in which the second substrate oriented in the one direction is arranged at the predetermined interval with the substrate group;

a disassembly process of disassembling the temporary batch lot by dividing the substrates into a first set and a second set such that two substrates facing each other among substrates constituting the temporary batch lot form different sets, and moving the first set and the second set relative to each other in a direction orthogonal to an arrangement direction of the substrates;

a half-rotation process of orienting the substrates constituting the second set in a direction opposite to the one direction by half-rotating the second set;

a rearrangement process of combining the first set and the second set to generate a batch lot such that the substrates oriented in the one direction and the substrates oriented in the opposite direction are alternately arranged; and a processing process of immersing the batch lot in a processing liquid.

Operation and Effect

According to the above-described configuration, the temporary batch lot in which the substrates are oriented in the same direction is formed. Then, the substrates are divided into a first set and a second set such that two substrates facing each other among the substrates constituting the temporary batch lot form different sets, and the second set is half-rotated. Then, by combining the first set and the second set, the substrates oriented in one direction and the substrates oriented in the opposite direction are alternately arranged to generate a batch lot. With this configuration, the substrates can be arranged face-to-face while the arrangement pitch of the substrates is narrower than that in the conventional method.

Further, it is preferable in the above-described configuration that in the disassembly process, the temporary batch lot is disassembled such that the substrates positioned at one end of the temporary batch lot and the substrates positioned at the other end of the temporary batch lot are divided into different sets.

Operation and Effect

According to the above-described configuration, in the disassembly process, the batch lot is disassembled such that the substrates positioned at one end of the temporary batch lot and the substrates positioned at the other end of the temporary batch lot are divided into different sets. With such a configuration, the orientation of the substrate constituting the batch lot can be made desired. That is, according to the above-described configuration, since the orientation of the substrates at one end and the orientation of the substrates at the other end in the batch lot can be made different, the arrangement of the substrates can be made face-to-face more reliably.

It is preferable in the above-described configuration that the number of substrates constituting the batch lot is three times the number of the substrate group in the substrate group acquisition process.

Operation and Effect

According to the above-described configuration, the number of substrates constituting the batch lot is three times the number of the substrate group in the substrate group acquisition process. With this configuration, no extra substrate is generated in the substrate group when the batch lot is formed. Since the substrate group is not divided into two batch lots, it is possible to reliably match the history of substrate processing in the substrates constituting the substrate group.

Furthermore, it is preferable in the above-described configuration that, a first process of collectively acquiring each substrate from a carrier that houses substrates that are in a horizontal posture and arranged at a predetermined interval in a vertical direction, and a second process of collectively converting the posture of each substrate from a horizontal posture to a vertical posture are provided, and the first process and the second process are performed before each assembly process.

Operation and Effect

According to the above-described configuration, a first process of collectively acquiring each substrate from a carrier that houses substrates that are in a horizontal posture and arranged at a predetermined interval in a vertical direction, and a second process of collectively converting the posture of each substrate from a horizontal posture to a vertical posture are provided, and the first process and the second process are performed before each assembly process. With this configuration, it is possible to provide a substrate processing method executed by receiving the first set of substrates or the second set of substrates arranged in one direction from the carrier.

Furthermore, it is preferable in the above-described configuration that, the predetermined interval is equal to the arrangement pitch of the substrates housed in the carrier.

Operation and Effect

According to the above-described configuration, the predetermined interval is equal to the arrangement pitch of the substrates housed in the carrier. With this configuration, it is easy to change the pitch of the substrate.

Furthermore, it is preferable in the above-described configuration that, the distance from the first position to the second position is ⅓ times the arrangement pitch of the substrates housed in the carrier.

Operation and Effect

According to the above-described configuration, the distance from the first position to the second position is ⅓ of the arrangement pitch of the substrates housed in the carrier. With this configuration, the pitch of the substrate arrangement to be generated can be ½ or less of the arrangement pitch of the substrates housed in the carrier.

Furthermore, it is preferable in the above-described configuration that, the first position and the second position are obtained by equally dividing the predetermined interval into three.

Operation and Effect

According to the above-described configuration, the first position and the second position equally divide the predetermined interval into three. With this configuration, the substrates can be arranged more orderly.

According to the present invention, it is possible to provide a substrate processing method of narrowing the arrangement pitch of substrates and efficiently performing substrate processing.

BRIEF OF DESCRIPTION OF THE DRAWINGS

DESCRIPTION OF THE PREFERRED EMBODIMENTS

Figure 1:
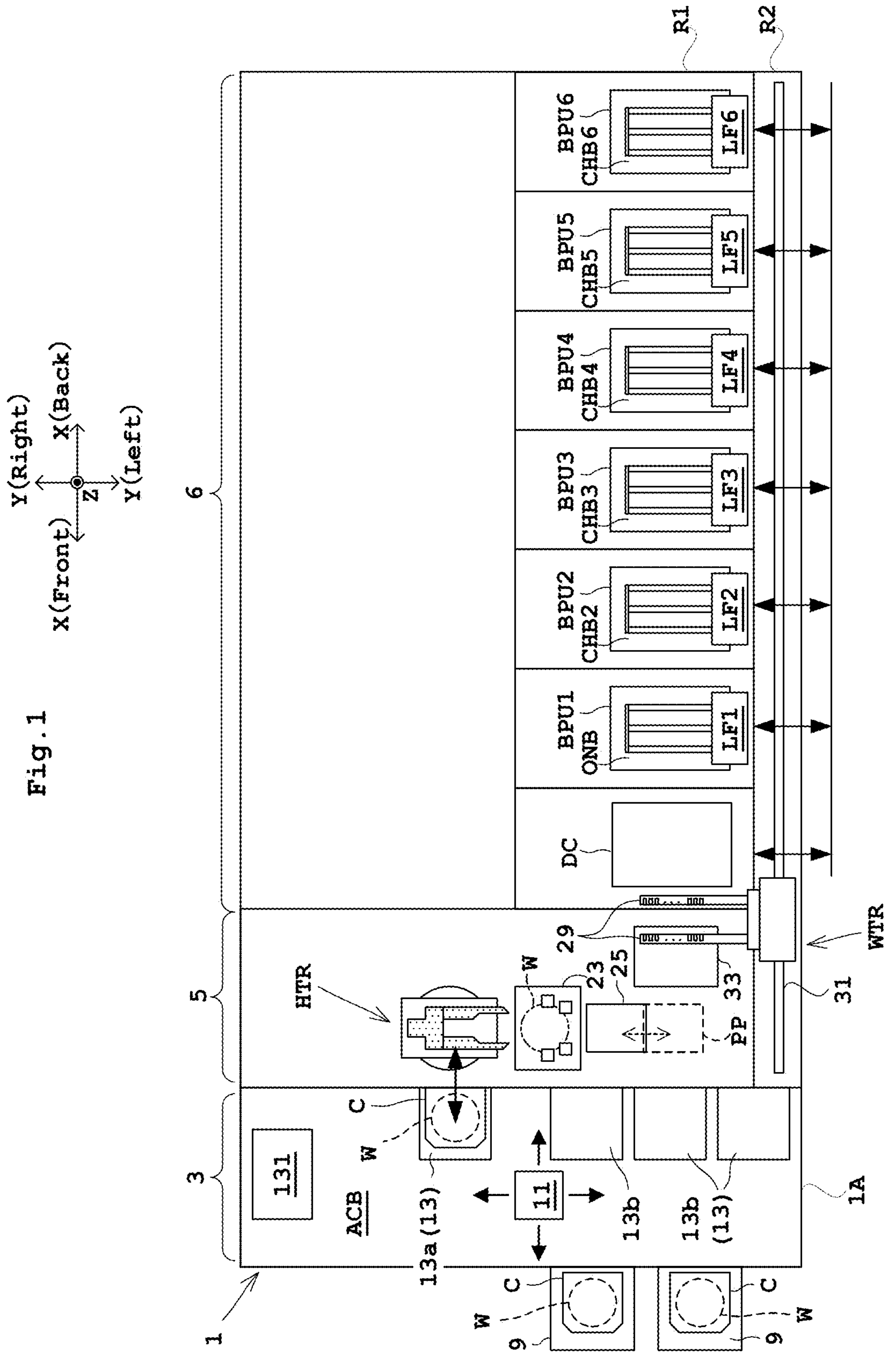
FIG. 1 is a plan view for explaining an overall configuration of a substrate processing apparatus according to an embodiment.

Hereinafter, embodiments of the present invention will be described with reference to the drawings. The substrate processing apparatus of the embodiment takes in substrates arranged at a pitch of 10 mm, and converts the arrangement pitch of the substrates to 10/3 mm to form a batch lot. The formed batch lot is subjected to various substrate processing such as chemical solution processing. When the substrate processing is performed by narrowing the arrangement pitch of the substrates in this manner, a required amount of chemical solution is reduced, so that it is possible to reduce the running cost and perform the substrate processing in consideration of the environment.

The present invention relates to a substrate processing method for collectively processing a plurality of substrates having directions defined by a front surface and a back surface. The front surface of the substrate is a device surface to be subjected to film formation processing and exposure processing. The back surface is a surface opposite to the device surface. When the substrate is held in a horizontal posture, the front surface of the substrate faces upward.

Embodiment

1. Overall Configuration

The substrate processing apparatus 1 according to the present invention is configured to perform batch processing, and includes a housing 1A that houses each block constituting the substrate processing apparatus 1. The housing 1A has a load port 9 protruding from a first wall surface orthogonal to the Y direction from a processing block 6 toward a transfer block 5. In the load port 9, a carrier C that houses a substrate arrangement in which substrates W in a horizontal posture are arranged in the vertical direction at a specific pitch can be placed.

In the present specification, for convenience, a direction in which the stocker block 3, the transfer block 5, and the processing block 6 in the substrate processing apparatus 1 are arranged is referred to as a "front-back direction X". The front-back direction X extends horizontally. Of the front-back direction X, the direction from the transfer block 5 toward the stocker block 3 in the substrate processing apparatus 1 is referred to as "front side". A direction opposite to the front is referred to as "back side". A direction extending horizontally and orthogonal to the front-back direction X is referred to as a "width direction Y". One direction of the "width direction Y" is referred to as a "right side" for convenience, and the other direction is referred to as a "left side" for convenience. A direction (height direction) orthogonal to the front-back direction X and the width direction Y is referred to as a "vertical direction Z" for convenience. In each drawing, front, back, upper, lower, right, and left are appropriately shown for reference.

2. Stocker Block

As illustrated in FIG. 1, the stocker block 3 includes a load port 9 which is an entrance when a carrier C for housing a plurality of substrates W in a horizontal posture at predetermined intervals in a vertical direction is input into the block. The load port 9 protrudes from the outer wall of the stocker block 3 extending in the width direction (Y direction).

A plurality of substrates W (for example, 25 sheets) are stacked and housed in one carrier C at regular intervals in the horizontal posture. The carrier C storing the unprocessed substrates W carried into the substrate processing apparatus 1 is first placed on the load port 9.

Figure 2:
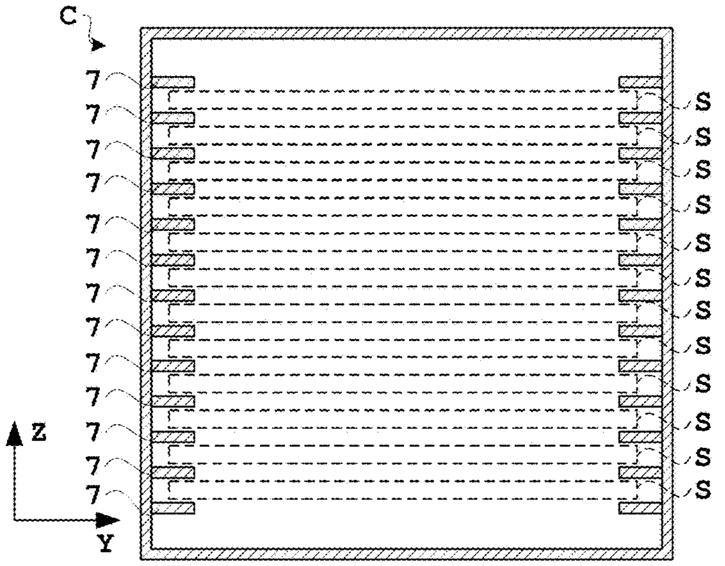
FIG. 2 is a schematic diagram illustrating a configuration of a carrier according to the embodiment.

FIG. 2 illustrates a configuration of a carrier C of the present invention. The carrier C is formed with a plurality of slots S extending in the horizontal direction to hold the surfaces of the substrates W in a state of being separated from each other. The slots S are arranged in the vertical direction at a specific pitch (for example, 10 mm), and the substrates W are accommodated in each of the slots S. 25 slots S are provided in one carrier C. Therefore, in the carrier C, 25 substrates W are arranged in the vertical direction at a specific pitch. A placement plate 7 is positioned to partition each slot S and, together with its paired placement plate 7, supports both ends of each of the substrates W. Therefore, the placement plates 7 are arranged one by one on the side surface of the carrier C and the surface parallel to the side surface. As the carrier C, for example, there is a sealed front opening unify pod (FOUP). In the present invention, an open type container may be employed as the carrier C.

The internal structure of the stocker block 3 will be described. The stocker block 3 includes a conveyance/storage unit ACB that stocks and manages the carrier C. The conveyance/storage unit ACB includes a carrier conveyance mechanism 11 that conveys the carrier C and a shelf 13 on which the carrier C is placed. The number of carriers C that can be stocked by the stocker block 3 is one or more.

The stocker block 3 has a plurality of shelves 13 on which the carrier C is placed. The shelf 13 is provided on a partition wall separating the stocker block 3 and the transfer block 5. The shelf 13 includes a stock shelf 13*b* on which the carrier Cis simply temporarily placed and a carrier placement shelf 13*a* on which a first handling robot HTR of the transfer block 5 accesses and from which the substrate is taken out.

The carrier placement shelf 13*a* has a configuration on which the carrier C can be placed. The carrier placement shelf 13*a* is configured to place the carrier C, from which the substrates W are to be taken out. In the present embodiment, one carrier placement shelf 13*a* is provided, but a plurality of carrier placement shelves 13*a* may be provided. The carrier conveyance mechanism 11 takes in the carrier C housing the unprocessed substrates W from the load port 9 and places the carrier C on the carrier placement shelf 13*a* for substrate extraction. At this time, the carrier conveyance mechanism 11 can also temporarily place the carrier C on the stock shelf 13*b* before placing the carrier C on the carrier placement shelf 13*a*. The number of carrier placement shelves 13*a* included in the stocker block 3 is 1 or more.

Note that the carrier placement shelf 13*a* is also configured to place an empty carrier C for housing the processed substrates W. The processed substrates W are housed in the carrier C waiting on the carrier placement shelf 13*a*. The carrier conveyance mechanism 11 obtains the carrier C storing the processed substrates W from the carrier placement shelf 13*a* and conveys the carrier C to the load port 9. When the carrier C is conveyed to the load port 9, the carrier conveyance mechanism 11 may temporarily place the carrier C on the shelf 13*b* for stock.

3. Transfer Block

The transfer block 5 is adjacent to the carrier placement shelf 13*a*. The transfer block 5 is disposed adjacent to the back side of the stocker block 3. The transfer block 5 includes a handling robot HTR that can access the carrier C placed on the carrier placement shelf 13*a* for substrate extraction, an HVC posture converter 23 that collectively converts the posture of the plurality of substrates W from the horizontal posture to the vertical posture, and a pusher mechanism 25. The HVC posture converter 23 collectively converts the plurality of substrates W from the horizontal posture to the vertical posture. Further, in the transfer block 5, a substrate transfer position PP for transferring a plurality of substrates W to an advance/retract conveyance mechanism WTR provided in a collective conveyance region R2 is set.

Figure 3:
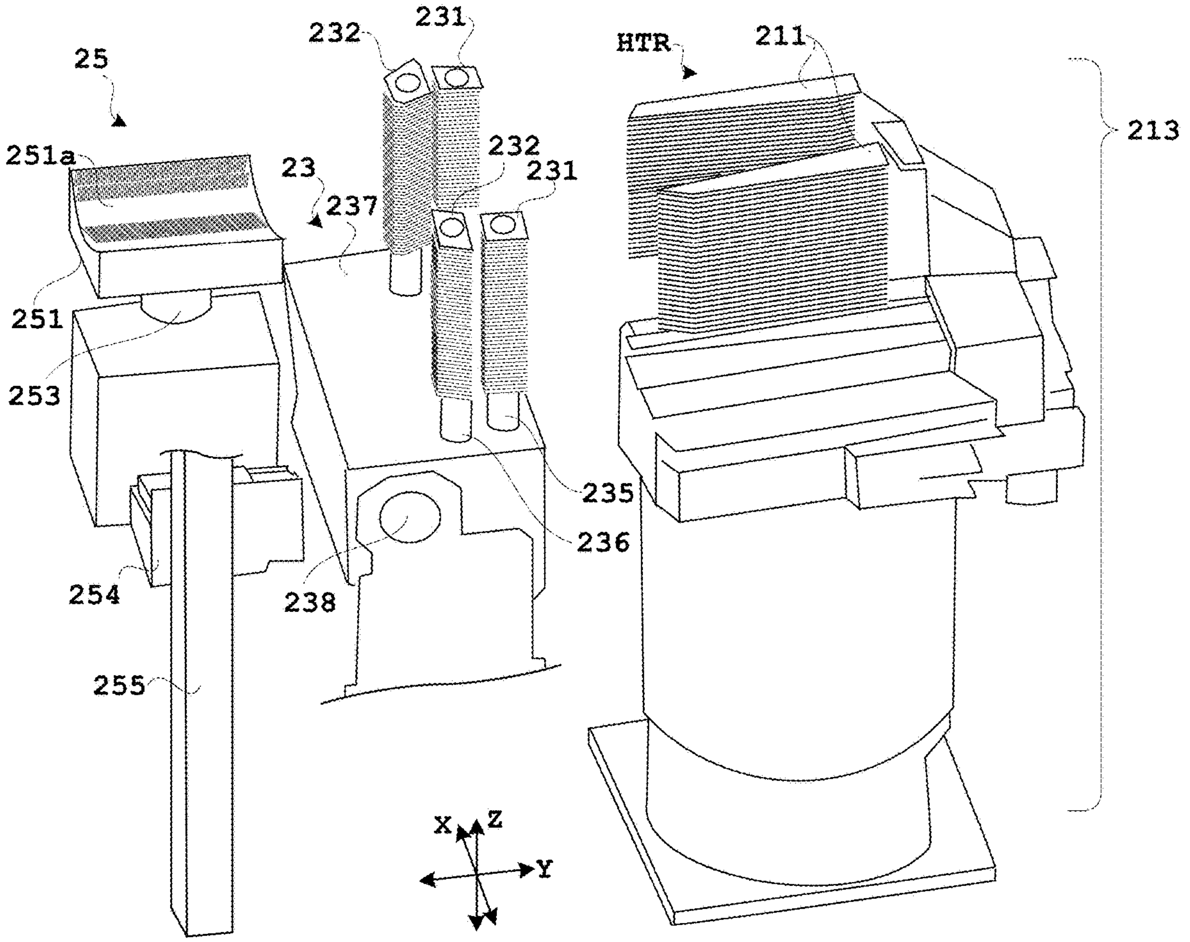
FIG. 3 is a perspective view for explaining each unit constituting a transfer block according to the embodiment.

As illustrated in FIG. 3, the handling robot HTR, the HVC posture converter 23, and the pusher mechanism 25 are arranged in this order in the Y direction. The handling robot HTR includes hands 211 capable of gripping substrates W in the horizontal posture. The hand 211 can grip one substrate W. In the handling robot HTR, the hands 211 are arranged in the vertical direction. The handling robot HTR can convey a plurality of substrates W at one time by gripping the substrates with each of the hands 211. The movement support mechanism 213 is a mechanism constituting the handling robot HTR, and is configured to rotate the hands 211 around the vertical axis, raise and lower the hands 211, advance and retract the hands 211 in the front-back direction X, or traverse in the left-right direction Y.

Figure 4:
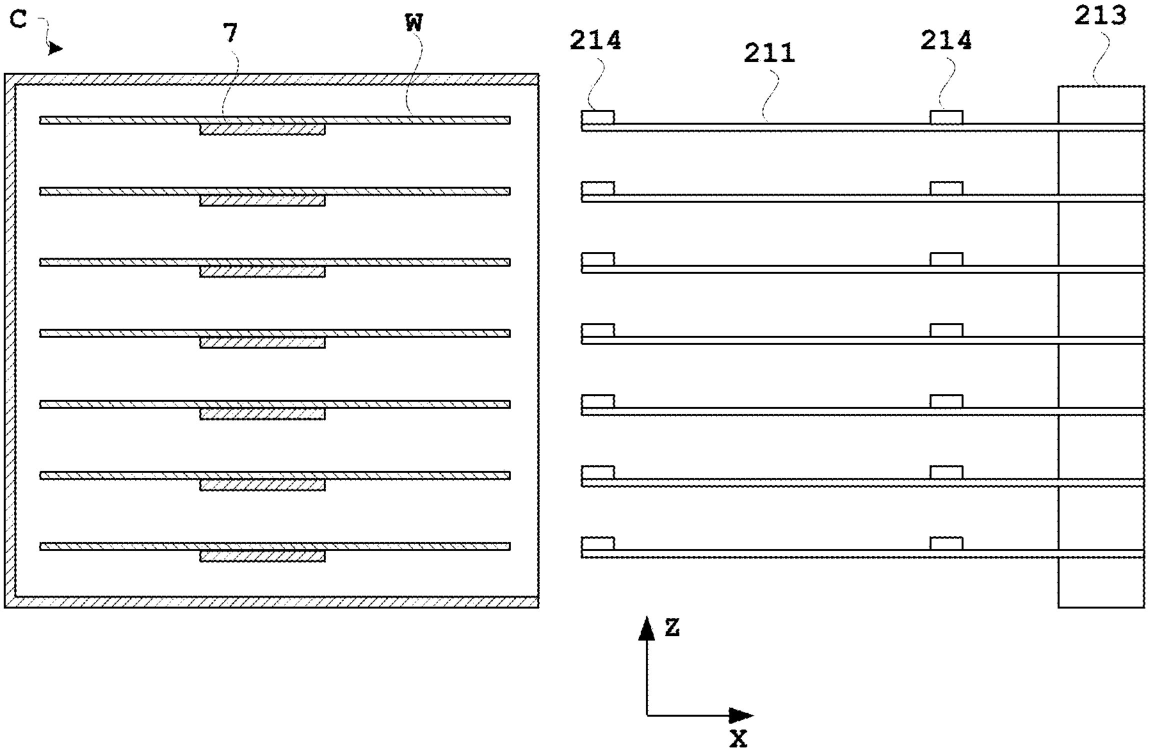
FIG. 4 is a comparative view of a configuration of a carrier and a configuration of a handling robot according to the embodiment.

FIG. 4 illustrates a state where the handling robot HTR receives the substrates W in the carrier C using the hands 211. As illustrated in FIG. 4, the hands 211 are arranged in the vertical direction at an arrangement pitch of the slots S provided in the carrier C. That is, the hands 211 are arranged at a pitch of 10 mm. 10 mm corresponds to a predetermined interval of the present invention, and is represented by an arrangement pitch Da in each drawing. The handling robot HTR conveys all of the substrates W arranged at intervals of 10 mm on the carrier C at one time. Since the front surfaces of the substrates W housed in the carrier C all face upward, the substrates W extracted by the handling robot HTR all face upward. Note that each of the hands 211 is provided with a guide 214 that brings a peripheral portion of the substrate into contact with the guide 214. The guide is provided at the distal end portion and the proximal end portion of the pair of blades constituting the hands 211. Therefore, four guides 214 are provided in the hands 211.

The handling robot HTR has 25 hands 211. The handling robot HTR collectively conveys the 25 substrates housed in the carrier C.

The HVC posture converter 23 illustrated in FIG. 3 is configured to convert the substrate W taken out from the carrier C from a horizontal posture to a vertical posture by the handling robot HTR. The HVC posture converter 23 includes a pair of placing rods 231 and a pair of clamping rods 232 extending in the vertical direction (Z direction). The support base 237 has a support surface extending in an XY plane that supports the placing rods 231 and the clamping rods 232. A rotary drive mechanism 238 is configured to rotate the placing rods 231 and the clamping rods 232 together with the support base 237 by 90°. This rotation causes the placing rods 231 and the clamping rods 232 to extend in the left-right direction (Y direction).

The placing rod 231 each includes a rod driving mechanism 235 that rotates about a rotation axis along the extending direction. The pair of placing rods 231 can be synchronously rotated by a pair of rod driving mechanisms 235. The rod driving mechanism 235 can extend and contract the placing rod 231. A specific example when the placing rod 231 is driven by the rod driving mechanism 235 will be described later.

The clamping rod 232 each includes a rod rotary mechanism 236 that rotates about a rotation axis along the extending direction. The pair of clamping rods 232 can be synchronously rotated by a pair of rod rotary mechanisms 236.

Figure 5:
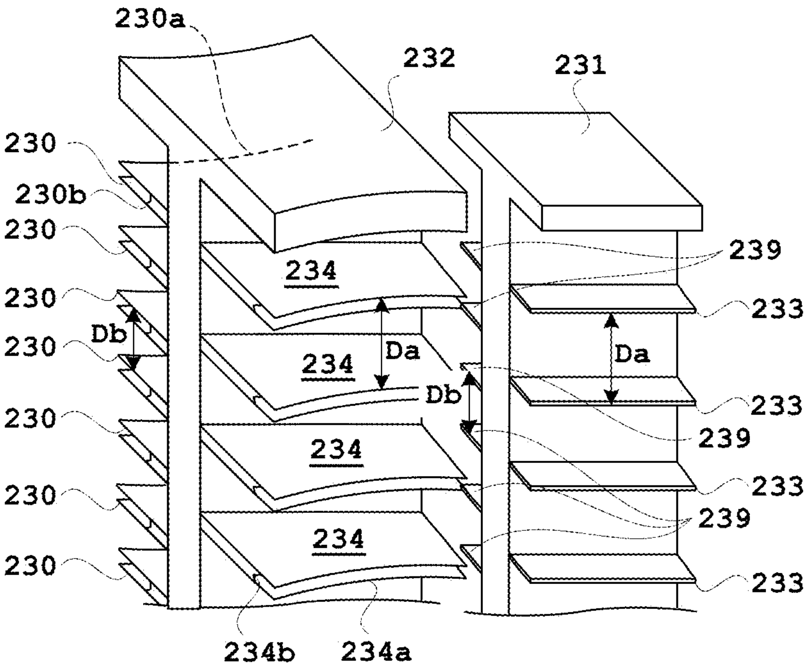
FIG. 5 is a perspective view illustrating a configuration of an HVC posture converter according to the embodiment.

FIG. 5 illustrates flat plates 233 and flat plates 239 of the placing rod 231. The flat plates 233 are arranged on the placing rod 231 at a pitch of 10 mm in an extending direction of the placing rod 231. Each of the flat plates 233 is a plate extending on a plane orthogonal to the arrangement direction of the flat plates 233, and the substrate W is supported by the placing rod 231 when the end of the substrate W is placed on the upper surface of the flat plate 233. Since it is not possible to hold the entire substrate W only by holding one end portion of the substrate W, two placing rods 231 are provided in the HVC posture converter 23. One end of the substrate W is held by the flat plate 233 of one placing rod 231, and the other end of the substrate W is held by the flat plate 233 of the other placing rod 231. One end and the other end are separated by a distance of the diameter of the substrate W. Therefore, the pair of placing rods 231 is separated by a distance of the diameter of the substrate Was illustrated in FIG. 7A. In this way, the substrate W held by the flat plate 233 does not float from the flat plate 233. This is because the weight of the substrate W is symmetrically applied to the flat plate 233, so that the weight of the substrate W in the flat plate 233 is balanced between the left and right. The pair of placing rods 231 is parallel to each other.

The flat plates 239 are arranged on the placing rod 231 at a pitch of 20/3 mm in an extending direction of the placing rod 231. The 20/3 mm pitch is referred to as an arrangement pitch Db. The flat plate 239 is a plate extending on a plane orthogonal to the arrangement direction of the flat plates 233. On the flat plate 239, similarly to the flat plate 233, the end portion of the substrate W is placed on the upper surface of the flat plate 233, whereby the substrate W is supported by the placing rod 231. Two placing rods 231 are provided in the HVC posture converter 23. One end of the substrate W is held by the flat plate 239 of one placing rod 231, and the other end of the substrate W is held by the flat plate 239 of the other placing rod 231.

In this manner, the placing rod 231 has one surface on which the flat plates 233 are arranged and the other surface on which the flat plates 239 are arranged. The placing rod 231 can rotate about a rotation axis along the extending direction, and the surface facing the substrate W can be switched between one surface related to the flat plate 233 and the other surface related to the flat plate 239. In the placing rod 231 in the initial state, as illustrated in FIG. 5, one surface related to the flat plate 233 faces the substrate W. Therefore, the HVC posture converter 23 in the initial state holds the substrate W by the flat plate 233.

FIG. 5 illustrates clamping plates 234 and clamping plates 230 of the clamping rod 232. The clamping plate 234 has an arcuate side 234*a* along the curve of the substrate W, and the arcuate side 234*a* is provided with a V groove 234*b* for clamping the substrate W. Since the substrate W has a shape along the curve of the arcuate side 234*a*, the substrate W is clamped in the V groove 234*b* of the arcuate side 234*a*. The clamping plates 234 are arranged on the clamping rod 232 at a pitch of 10 mm in the extending direction of the clamping rod 232. Each of the clamping plates 234 is a plate extending on a plane orthogonal to the arrangement direction of the clamping plates 234, and a part of the substrate W is fitted into the V groove 234*b* of the arcuate side 234*a*, so that the substrate W is clamped by the clamping rod 232.

Figure 8:
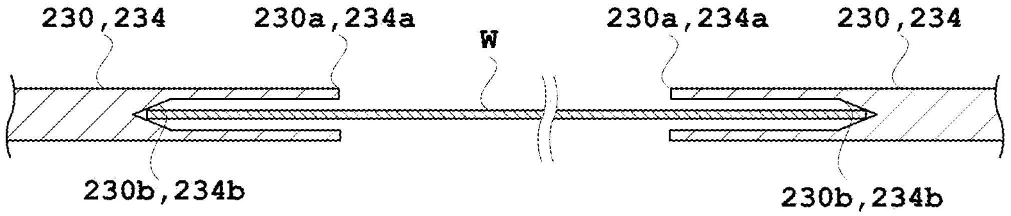
FIG. 8 is a cross-sectional view for explaining a groove included in a clamping rod according to the embodiment.
Figure 10:
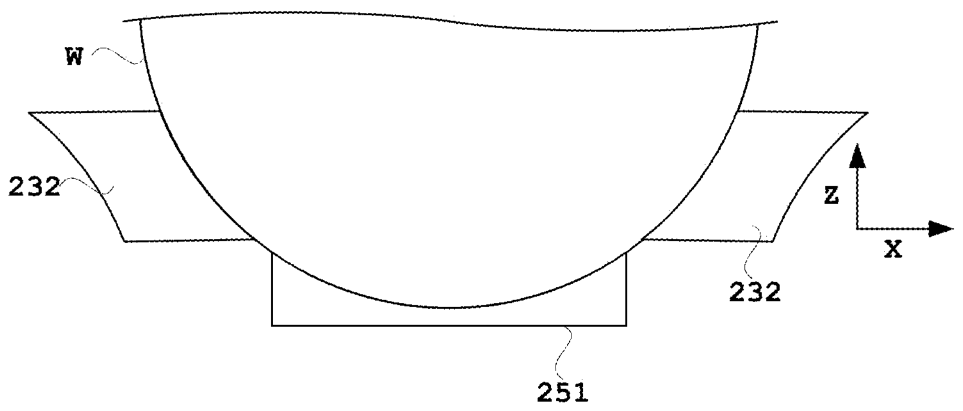
FIG. 10 is a schematic diagram illustrating a pusher according to the embodiment.

Note that, since it is not possible to realize the clamping of the entire substrate W only by clamping a part of the substrate W, two clamping rods 232 are provided in the HVC posture converter 23. A part of the substrate W is clamped by the clamping plate 234 of one clamping rod 232, and a part of the substrate W is clamped by the clamping plate 234 of the other clamping rod 232. The pair of clamping rods 232 is separated by a distance shorter than the diameter of the substrate W. Since the pair of clamping rods 232 is configured to clamp the substrate W in the vertical posture, it is sufficient that the pair of clamping rods 232 is configured to clamp the lower side of the substrate W, and it is not necessary to separate the pair of clamping rods 232 by the diameter of the substrate W unlike the placing rod 231. Nevertheless, as illustrated in FIG. 10, since the clamping rod 232 is disposed at a position shifted from the bottom portion of the substrate W in the vertical posture, two of a rod for clamping a portion on the right side as viewed from the bottom portion of the substrate W and a rod for clamping a portion on the left side as viewed from the bottom portion of the substrate W are required. As illustrated in FIG. 5C, the two clamping rods 232 clamp the substrate W from both sides by the V groove 234*b* of the clamping plate 234. The pair of clamping rods 232 is parallel to each other. As illustrated in FIG. 8, the two clamping rods 232 clamp the substrate W from both sides by the V groove 234*b* of the clamping plate 234. The pair of clamping rods 232 is parallel to each other.

The clamping plates 230 are arranged on the clamping rod 232 at a pitch of 20/3 mm in the extending direction of the clamping rod 232. The clamping plate 230 is a plate extending on a plane orthogonal to the arrangement direction of the clamping plates 230. Similarly to the clamping plate 234, the clamping plate 230 has an arcuate side 230*a* along the curve of the substrate W, and the arcuate side 230*a* is provided with a V groove 230*b* for clamping the substrate W.

In this manner, the clamping rod 232 has one surface on which the clamping plates 234 are arranged and the other surface on which the clamping plates 230 are arranged. The clamping plate 234 can rotate about a rotation axis along the extending direction, and the surface facing the substrate W can be switched between one surface related to the clamping plate 234 and the other surface related to the clamping plate 230. In the clamping rod 232 in the initial state, as illustrated in FIG. 5, one surface related to the clamping plate 234 faces the substrate W. Therefore, the HVC posture converter 23 in the initial state holds the substrate W by the clamping plate 234.

Figure 6:
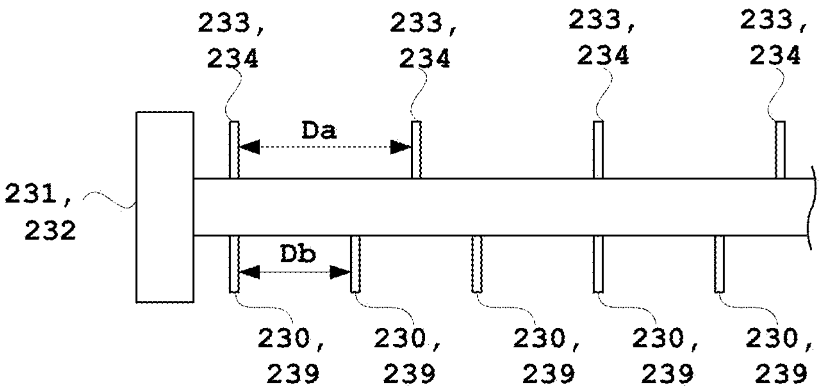
FIG. 6 is a schematic view illustrating configurations of a placing rod and a clamping rod according to an embodiment.

FIG. 6 illustrates the arrangement pitch of the flat plates 233 and 239 of the placing rod 231. The arrangement pitch Da of the flat plates 233 is 10 mm, and the arrangement pitch Db of the flat plates 239 is 20/3 mm. Therefore, one flat plate 233 is positioned between a pair of flat plates 233 separated by a width of 20 mm in the extending direction of the placing rod 231. On the other hand, two flat plates 239 are positioned between a pair of flat plates 239 separated by a width of 20 mm in the extending direction of the placing rod 231.

FIG. 6 also illustrates an arrangement pitch of the clamping plates 234 and the clamping plates 230 of the clamping rod 232. The arrangement pitch Da of the clamping plates 234 is 10 mm, and the arrangement pitch Db of the clamping plates 230 is 20/3 mm. Therefore, one clamping plate 234 is positioned between a pair of clamping plates 234 separated by a width of 20 mm in the extending direction of the clamping rod 232. On the other hand, two clamping plates 230 are positioned between a pair of clamping plates 230 separated by a width of 20 mm in the extending direction of the clamping rod 232.

The pusher mechanism 25 in FIG. 3 includes a pusher 251 capable of horizontally arranging substrates W in a vertical posture. The pusher 251 is a half-pipe type along the curve of the bottom portion of the substrate W. In the pusher 251 in the initial state, the U groove 251*a* constituting the half-pipe extends in the left-right direction Y. The pusher 251 in this state can receive the substrate W from the HVC posture converter 23.

Figure 9:
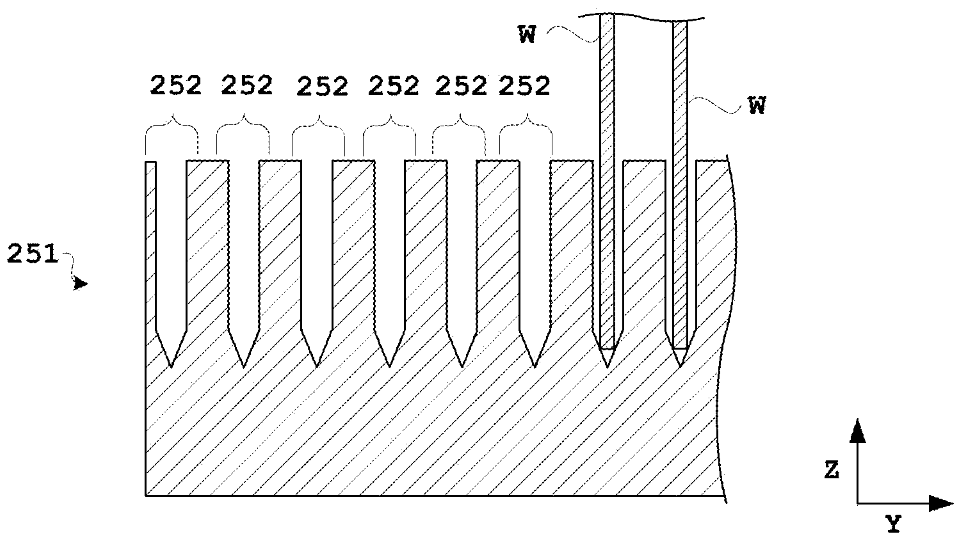
FIG. 9 is a schematic diagram illustrating a pusher according to the embodiment.

FIG. 9 is a cross-sectional view for explaining the configuration of the pusher 251. The pusher 251 has a plurality of V-shaped clamping grooves 252. The clamping grooves 252 are arranged in the extending direction of the U groove described with reference to FIG. 3. An arrangement pitch of the clamping grooves 252 is 10/3 mm. As illustrated in FIG. 9, one substrate W is clamped by each of the clamping grooves 252.

FIG. 10 illustrates a relationship between the pair of clamping rods 232 and the pusher 251. Unlike the state of FIG. 3, the pair of clamping rods 232 in FIG. 10 is tilted by 90° together with the support base 237 by the rotary drive mechanism 238. Therefore, the clamping rod 232 in FIG. 10 extends in the horizontal direction. As can be seen with reference to FIG. 10, the pusher 251 is at a position sandwiched between the pair of clamping rods 232 in the front-back direction X. Therefore, the pair of clamping rods 232 and the pusher 251 do not interfere with each other, and can cooperatively clamp the substrate W in the vertical posture.

The pusher rotation mechanism 253 in FIG. 3 can rotate the pusher 251 by at least 180°. The pusher rotation mechanism 253 can rotate the pusher 251 in the initial state to orient the pusher 251 in the opposite direction, or can rotate the pusher 251 oriented in the opposite direction to return the pusher 251 to the initial state. The pusher shift mechanism 254 can reciprocate the pusher 251 in the initial state in the left-right direction Y. The pusher shift mechanism 254 can bring the pusher 251 close to the HVC posture converter 23 or can bring the pusher 251 close to the advance/retract conveyance mechanism WTR.

A pusher lifting mechanism 255 can raise the pusher 251 at the initial position to the upper position. The pusher lifting mechanism 255 can also return the pusher 251 in the upper position to the initial position.

4. Pitch Change in Transfer Block

In the substrate processing apparatus of the present embodiment, since the arrangement pitch of the substrates W can be changed in the transfer block 5, this point will be described. The substrates W arranged at a pitch of 10 mm in the carrier C are first rearranged at a pitch of 10/3 mm in the transfer block 5. The temporary lot formed in this manner becomes a batch lot in which the substrates are arranged in a face-to-face method by the operation of the pusher mechanism 25. Hereinafter, this configuration will be specifically described.

Figure 11A:
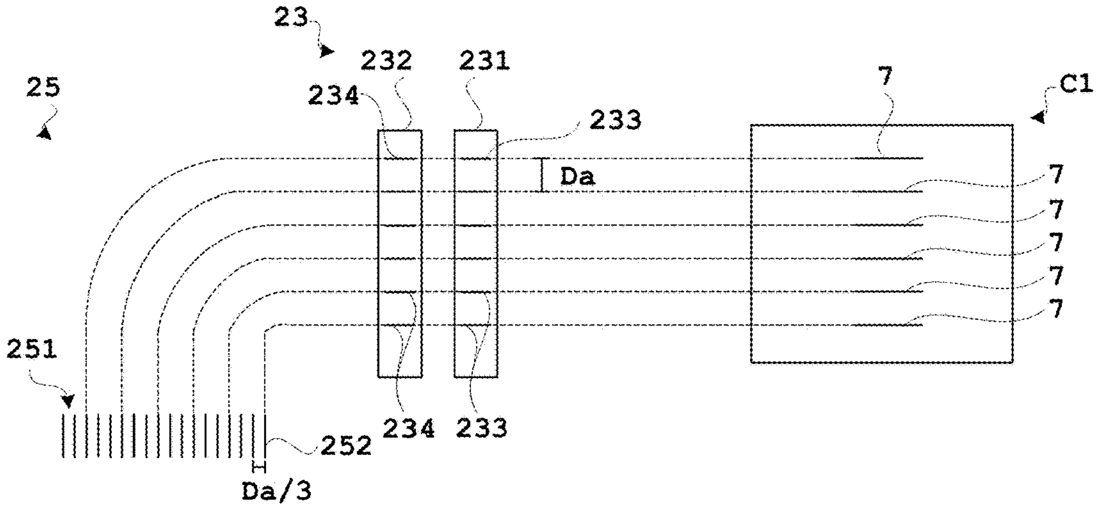
FIG. 11A is a schematic diagram illustrating a batch assembly according to the embodiment.

FIG. 11A compares the arrangement pitch of the substrates in each configuration. In the carrier C, the placement plates 7 constituting the slots S are arranged at a pitch of 10 mm. The placement plate 7 has the same configuration as the flat plate 233 of the placing rod 231. Therefore, the placement plates 7 are arranged in the vertical direction on one surface of the carrier C, and are arranged in the vertical direction on the other surface of the carrier C. Both ends of the substrate W are placed on the pair of placement plates 7 facing each other, so that the substrate W is held by the carrier C.

The flat plates 233 are arranged at a pitch of 10 mm on the placing rod 231 in the HVC posture converter 23. Therefore, the 25 substrates W held by the carrier C are collectively conveyed to the HVC posture converter 23. This conveyance is achieved by the handling robot HTR.

Figure 11B:
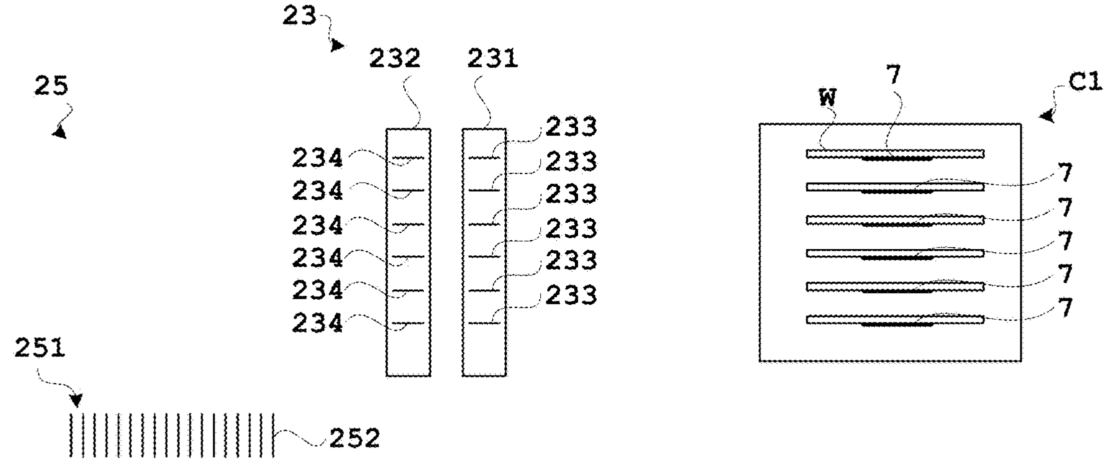
FIG. 11B is a schematic diagram illustrating a batch assembly according to the embodiment.

FIG. 11B schematically illustrates a state in which 25 substrates W are arranged on the carrier C. Since three carriers C of different individuals appear in the following description, the carrier C in FIG. 11B is referred to as a first carrier C1. In the first carrier C1, 25 substrates W are arranged at a pitch of 10 mm.

Figure 7A:
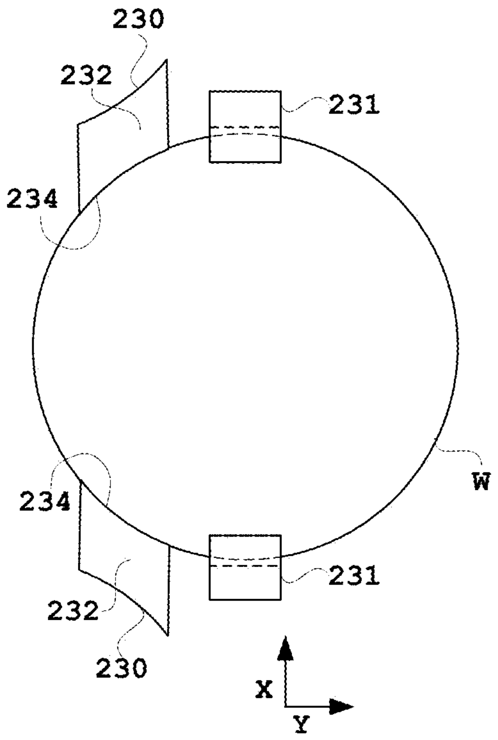
FIG. 7A is a plan view for explaining the configuration of each rod according to the embodiment.
Figure 11C:
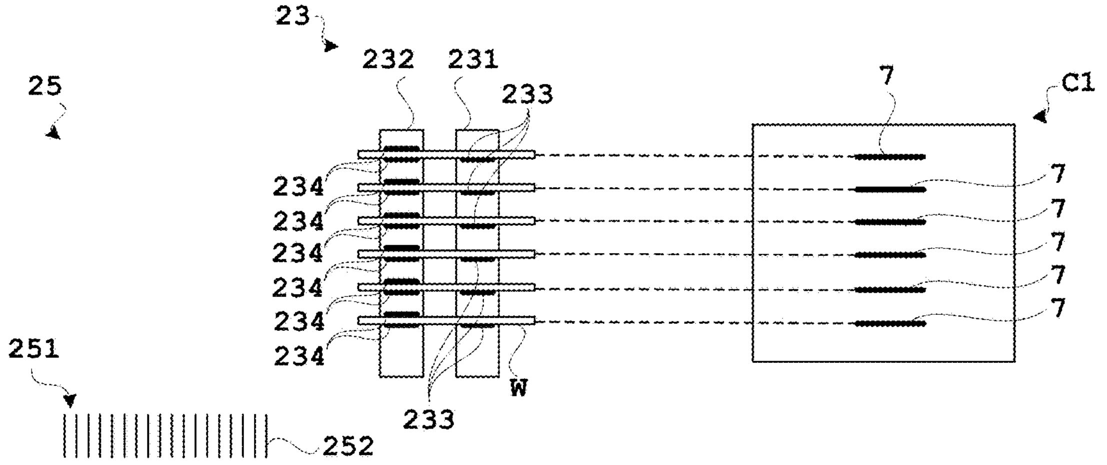
FIG. 11C is a schematic diagram illustrating a batch assembly according to the embodiment.

FIG. 11C illustrates a state in which the substrates W housed in the first carrier C1 are transferred to the HVC posture converter 23 by the handling robot HTR. FIG. 7A illustrates a state in which both ends of the substrate W are supported by the pair of placing rods 231 at this time.

Figure 7B:
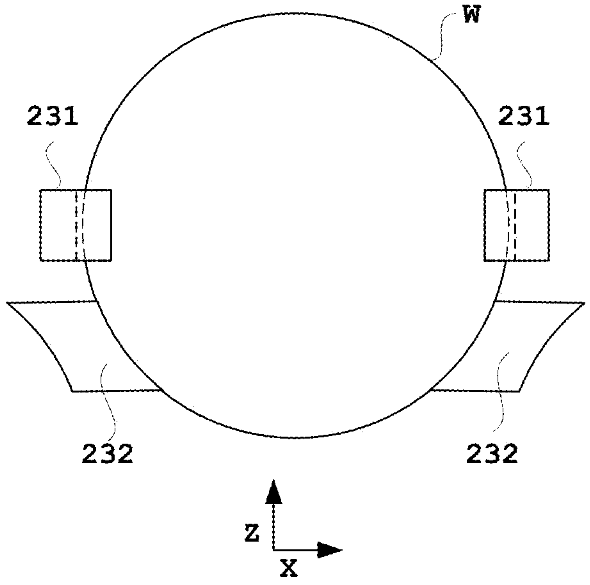
FIG. 7B is a plan view for explaining the configuration of each rod according to the embodiment.

At this time, the peripheral edge portion of the substrate W is in contact with each of the clamping plates 234 of the pair of clamping rods 232. Specifically, the peripheral edge portion of the substrate W is fitted into the V groove of the clamping plate 234. Therefore, even if the support base 237 is rotated by 90° in this state illustrated in FIG. 7B, since the substrate W is clamped by the V groove 234*b* of the clamping plate 234, the substrate W does not slide down from the HVC posture converter 23.

FIG. 11C also illustrates a state in which the placing rod 231 supports the substrate W by the flat plate 233. Similarly, FIG. 11 C illustrates a state in which the clamping rod 232 clamps the substrate W with the clamping plate 234.

Figure 11D:
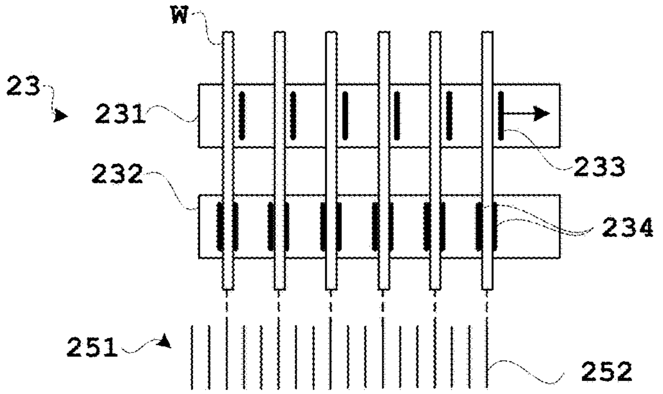
FIG. 11D is a schematic diagram illustrating a batch assembly according to the embodiment.

FIG. 11D illustrates a state when the rotary drive mechanism 238 in the HVC posture converter 23 operates. By this operation, the support base 237 is rotated by 90°, and the placing rod 231 and the clamping rod 232 are in a state of extending horizontally. Then, the load of the substrate W is transferred from the placing rod 231 to the clamping rod 232, and the flat plate 233 of the placing rod 231 is brought into a state of only being in contact with the substrate W. FIG. 11D illustrates a state where placing rod 231 is contracted by rod driving mechanism 235. When the placing rod 231 contracts, the flat plate 233 separates from the substrate W. Even when such an operation is performed, since the substrate W is supported by the clamping rod 232, the substrate W does not move along with the movement of the flat plate 233.

By separating the flat plate 233 from the substrate W, even if the substrate W clamped by the clamping rod 232 is lifted by the pusher 251, the flat plate 233 does not damage the back surface of the substrate W.

Figure 11E:
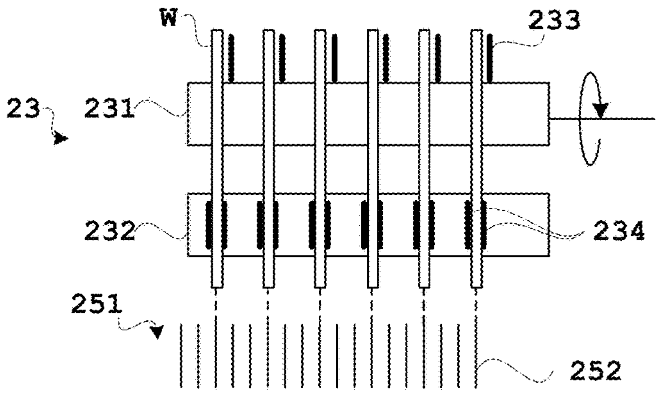
FIG. 11E is a schematic diagram illustrating a batch assembly according to the embodiment.

FIG. 11E illustrates a state when the placing rod 231 is rotated by 90° by rod driving mechanism 235. The flat plate 233 of the placing rod 231 faces upward by the rotation of the placing rod 231. This movement of the flat plate 233 is performed above the pusher 251. The placing rod 231 approaches the pusher 251 together with the substrate W clamped by the clamping rod 232, but at that time, the flat plate 233 does not collide with the substrate W held by the pusher 251. Since the pusher 251 in FIG. 11E does not clamp the substrate W, the rotation operation of the flat plate 233 can be omitted.

Figure 11F:
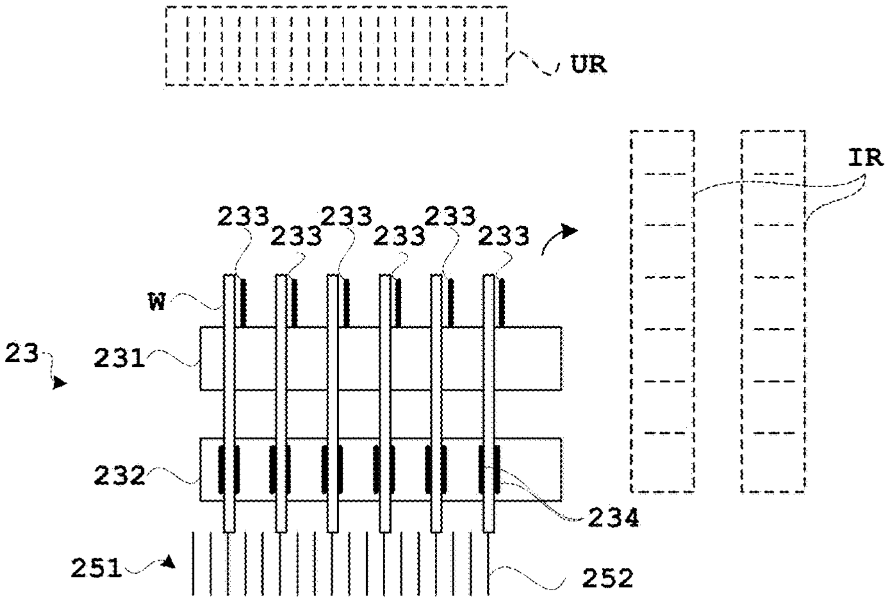
FIG. 11F is a schematic diagram illustrating a batch assembly according to the embodiment.

FIG. 11F illustrates a state when the pusher 251 subsequently rises. Then, the bottom portion of the substrate W clamped by the clamping rod 232 is fitted into the clamping groove 252 of the pusher 251. When the pusher 251 further rises in this state, the substrate W is removed from the clamping plate 234 of the clamping rod 232. In this manner, the substrate W is transferred from the HVC posture converter 23 to the pusher mechanism 25.

Thereafter, the pusher 251 rises to an upper position UR set above the placing rod 231. The pusher 251 located in the upper position UR does not collide with the placing rod 231 returned to the upright state. FIG. 11F also illustrates a state in which the placing rod 231 and the clamping rod 232 are moved to a virtual position IR indicated by broken lines by the rotary drive mechanism 238. At this time, the placing rod 231 that has contracted returns to the original stretched state. In addition, placing rod 231 reversely rotates to return to the original state described in FIG. 11C.

In this way, the substrates W arranged at a pitch of 10 mm are transferred from the HVC posture converter 23 to the pusher mechanism 25. The clamping groove 252 in the pusher 251 at this time includes a groove that clamps the substrate W and an empty groove that does not clamp the substrate W. The grooves that clamp the substrate W are separated from each other by 3 times the arrangement pitch of the clamping grooves 252. This is because the arrangement pitch of the clamping grooves 252 is 10/3 mm. 10 mm, which is the arrangement pitch of the substrates W, corresponds to exactly 3 times the arrangement pitch of the clamping groove 252. At this time, the substrates W arranged in the pusher 251 are referred to as an initial substrate group. The initial substrate group corresponds to the substrate group of the present invention. In the initial substrate group, substrates oriented in one direction are arranged at intervals of 10 mm. 10 mm corresponds to a predetermined interval of the present invention.

Figure 11G:
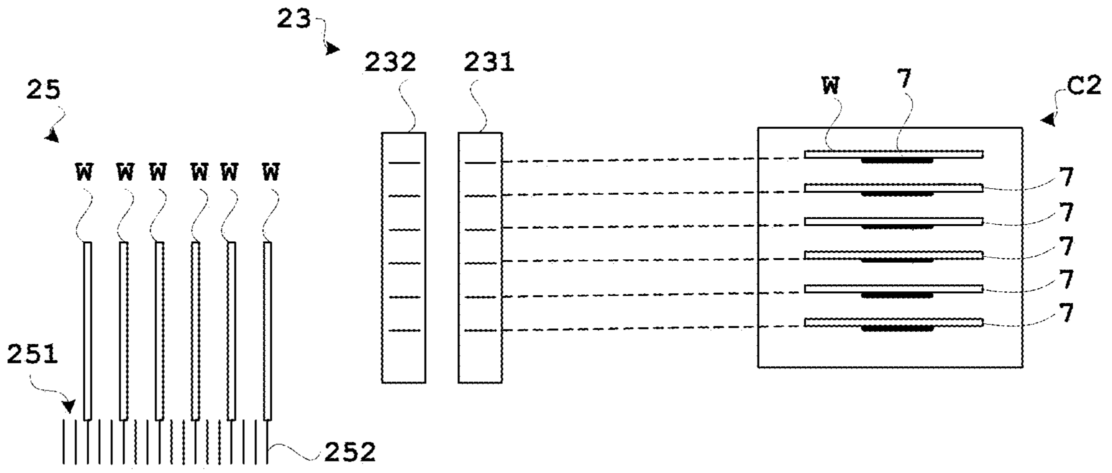
FIG. 11G is a schematic diagram illustrating a batch assembly according to the embodiment.

FIG. 11G illustrates a state in which the substrates W (first substrate) are conveyed from the second carrier C2 to the HVC posture converter 23 by broken lines. The second carrier C2 is a new carrier that the carrier conveyance mechanism 11 has transported to the carrier placement shelf 13*a* instead of the empty first carrier C1. This substrate conveyance process corresponds to the first process of the present invention. In the first process, each substrate is collectively acquired from the second carrier C2 housing the first substrates in which the substrates W in the horizontal posture are arranged at intervals of 10 mm in the vertical direction Z.

Figure 11H:
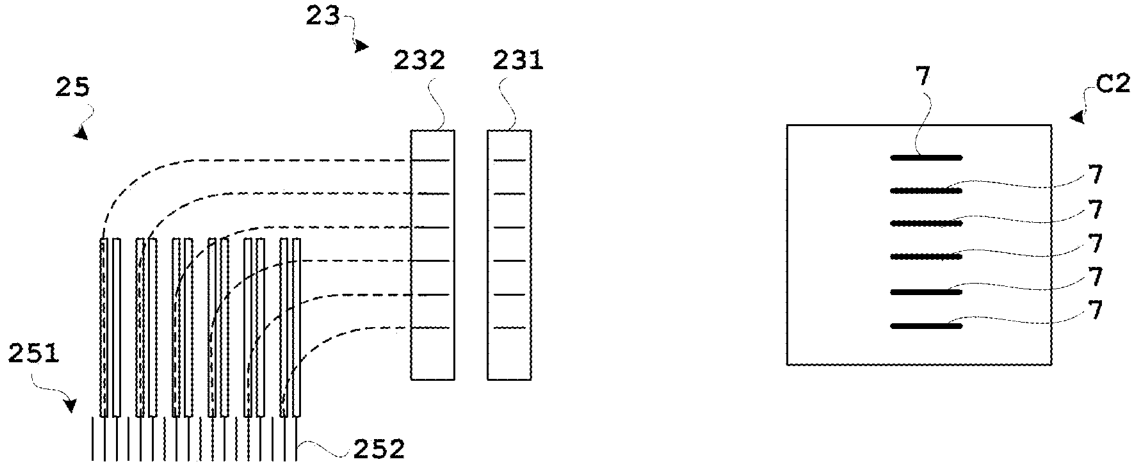
FIG. 11H is a schematic diagram illustrating a batch assembly according to the embodiment.

FIG. 11H illustrates a state in which the substrate W held by the HVC posture converter 23 is then transferred to the pusher 251. Among the clamping grooves 252 in the pusher 251, the clamping grooves 252 in which the substrates W related to the first carrier C1 are already fitted cannot clamp the substrates W any more. Therefore, the substrates W held by the HVC posture converter 23 are conveyed from the substrates W related to the first carrier C1 to a position shifted by one pitch in the arrangement of the clamping grooves 252, and are fitted into the clamping grooves 252 on the spot. Such positioning of the substrates W and the pusher 251 is realized by the pusher shift mechanism 254.

At this time, the tilting of the placing rod 231 and the clamping rod 232 and the contraction of the placing rod 231 described with reference to FIG. 11D are executed, which have already been specifically described. By the tilting motion of the clamping rod 232, the posture of each substrate W is collectively converted from the horizontal posture to the vertical posture. This operation corresponds to the second process of the present invention. Similarly, in FIG. 11H, the rotation of the placing rod 231 described with reference to FIG. 11E, the fitting of the substrate W into the pusher 251 described with reference to FIG. 11F, the rising and lowering of the pusher 251, the rising operation of the placing rod 231 and the clamping rod 232, the extending operation of the placing rod 231, and the reverse rotation operation of the placing rod 231 are also omitted.

Figure 12:
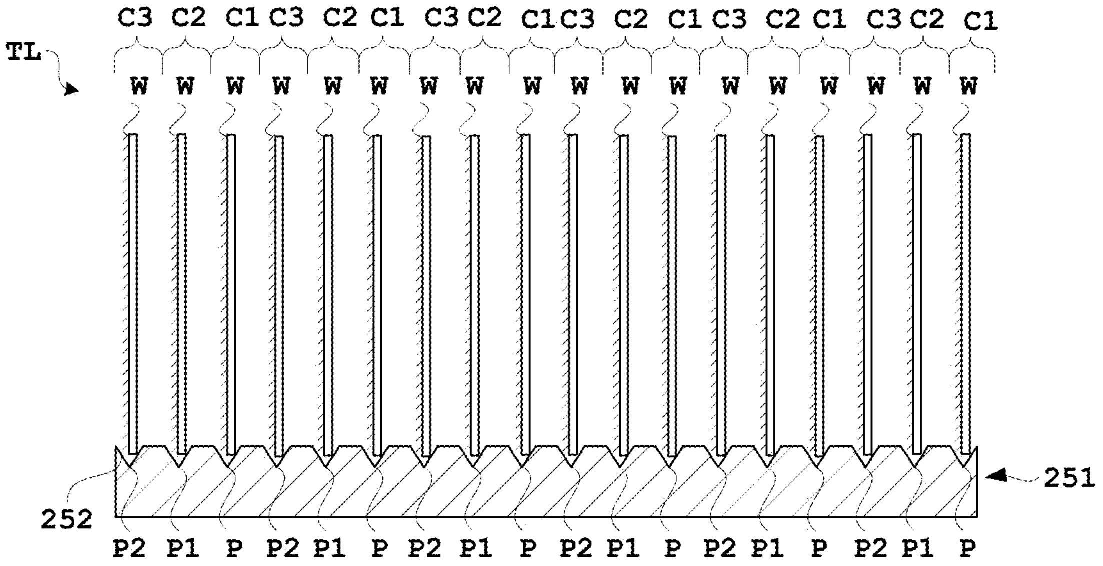
FIG. 12 is a schematic diagram illustrating a batch assembly according to the embodiment.

In this way, the substrates W related to the second carrier C2 are transferred from the HVC posture converter 23 to the pusher mechanism 25. In the pusher 251 at this time, a region in which two clamping grooves 252 that clamp the substrates W are continuous and a region in which empty grooves that do not clamp the substrates W are positioned are alternately arranged. That is, the first substrate is positioned at a predetermined position (first position P1) in the pusher 251 by combining the first arrangement in which the first substrate oriented in one direction is arranged at an interval of 10 mm with the initial substrate group. FIG. 12 can be referred to for the first position P1.

Figure 11I:
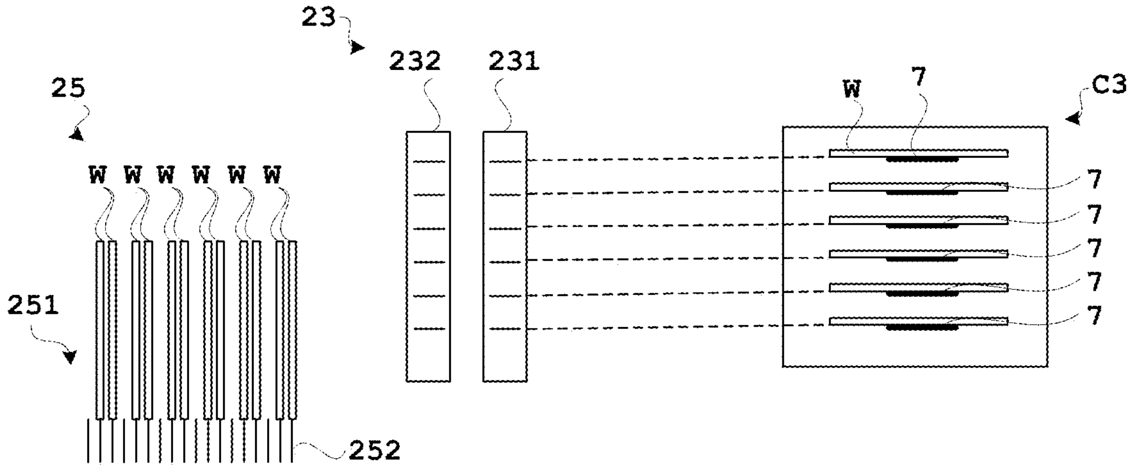
FIG. 11I is a schematic diagram illustrating a batch assembly according to the embodiment.

FIG. 11I illustrates a state in which the substrates W (second substrate) are conveyed from the third carrier C3 to the HVC posture converter 23 by broken lines. The third carrier C3 is a new carrier that the carrier conveyance mechanism 11 has transported to the carrier placement shelf 13*a* instead of the empty second carrier C2. This substrate conveyance process corresponds to the first process of the present invention. In the first process, each substrate is collectively acquired from the third carrier C3 housing the second substrates in which the substrates W in the horizontal posture are arranged at intervals of 10 mm in the vertical direction Z.

Figure 11J:
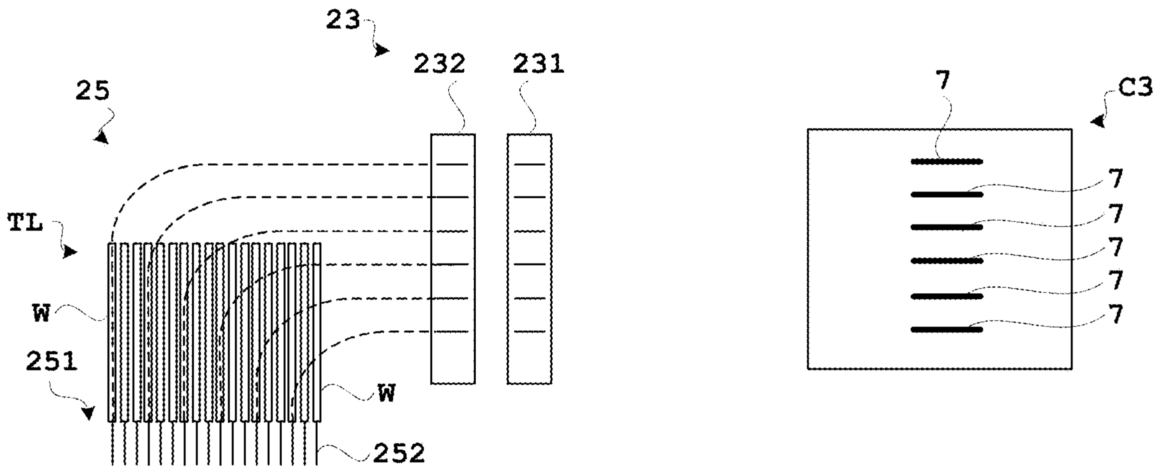
FIG. 11J is a schematic diagram illustrating a batch assembly according to the embodiment.

FIG. 11J illustrates a state in which the substrate W held by the HVC posture converter 23 is then transferred to the pusher 251. Among the clamping grooves 252 in the pusher 251, the clamping grooves 252 in which the substrates W related to the first carrier C1 and the second carrier C2 are already fitted cannot clamp the substrates W any more. Therefore, the substrates W held by the HVC posture converter 23 are conveyed from the substrates W related to the second carrier C2 to a position shifted by one pitch in the arrangement of the clamping grooves 252, and are fitted into the clamping grooves 252 on the spot. Such positioning of the substrates W and the pusher 251 is realized by the pusher shift mechanism 254.

At this time, the tilting of the placing rod 231 and the clamping rod 232 and the contraction of the placing rod 231 described with reference to FIG. 11D are executed, which have already been specifically described. By the tilting motion of the clamping rod 232, the posture of each substrate W is collectively converted from the horizontal posture to the vertical posture. This operation corresponds to the second process of the present invention. Similarly, in FIG. 11H, the rotation of the placing rod 231 described with reference to FIG. 11E, the fitting of the substrate W into the pusher 251 described with reference to FIG. 11F, the rising and lowering of the pusher 251, the rising operation of the placing rod 231 and the clamping rod 232, the extending operation of the placing rod 231, and the reverse rotation operation of the placing rod 231 are also omitted.

In this way, the substrates W related to the third carrier C3 are transferred from the HVC posture converter 23 to the pusher mechanism 25. The clamping grooves 252 in the pusher 251 at this time all clamp the substrates W. In this way, 75 substrates W are arranged on the pusher 251 at a pitch of 10/3 mm.

A substrate array thus produced is referred to as a temporary batch lot TL. Since the substrates W held by the carrier C are arranged at a pitch of 10 mm, the arrangement pitch of the substrates W of the carrier C is converted from 10 mm to 10/3 mm in the transfer block 5. That is, the second substrate is positioned at a predetermined position (second position P2) in the pusher 251 by combining the second arrangement in which the second substrate oriented in one direction is arranged at an interval of 10 mm with the initial substrate group. FIG. 12 can be referred to for the second position P2.

FIG. 12 illustrates the temporary batch lot TL. In the temporary batch lot TL, the substrates W derived from the third carrier C3, the substrates W derived from the second carrier C2, and the substrates derived from the first carrier C1 are repeatedly arranged in this order at a 10/3 mm pitch. These substrates W are all oriented in one direction. Therefore, the temporary batch lot TL is formed by arranging the substrates W by a face-to-back method.

Next, a relationship between the clamping groove 252 of the pusher 251 and the substrate W will be described. There are three types of positions where the clamping groove 252 is provided: a reference position P where the substrates W related to the first carrier C1 are positioned; a first position P1 where the substrates W related to the second carrier C2 are positioned; and a second position P2 where the substrates W related to the third carrier C3 are positioned. The reference positions P are arranged at a pitch of 10 mm in the pusher 251, and the first position P1 and the second position P2 divide 10 mm between the reference positions P into three. Specifically, 10 mm between the reference positions P is equally divided into three by the first position P1 and the second position P2. Therefore, the distance from the first position P1 to the second position P2 is ⅓ times of the arrangement pitch of the substrates W housed in the carrier C.

5. Rearrangement of Temporary Batch Lot

In the temporary batch lot TL configured in this manner, the orientation of the arranged substrates W is constant. Such an arrangement mode cannot be said to be optimal when batch chemical solution processing is performed. The transfer block 5 of the present embodiment can convert the arrangement mode of the substrates W from face-to-back to face-to-face by performing the disassembly operation and the rearrangement operation on the temporary batch lot TL.

Figure 13:
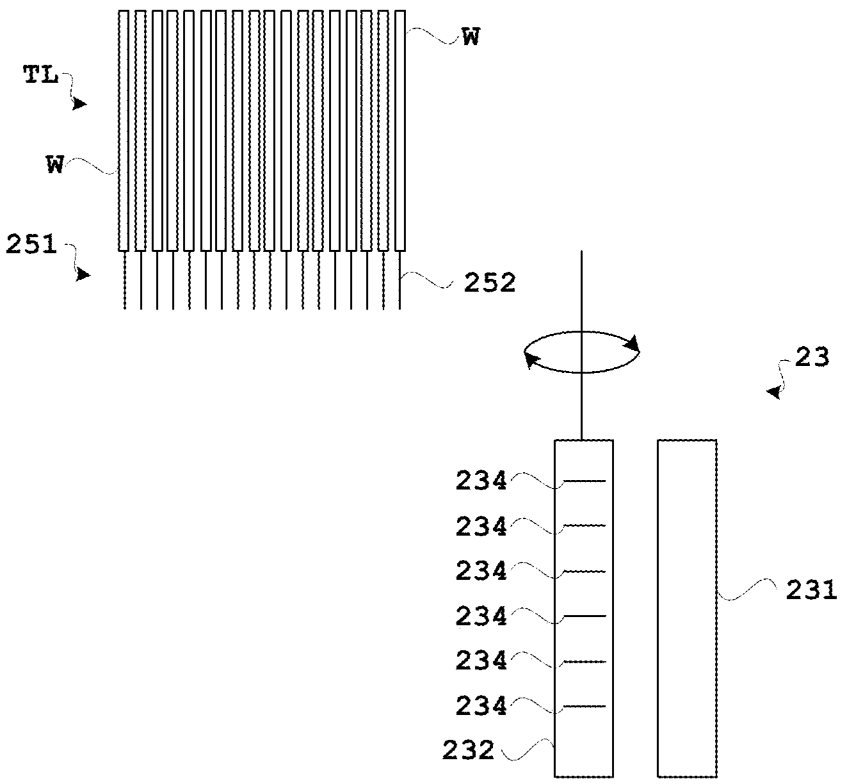
FIG. 13 is a schematic diagram illustrating a batch assembly according to the embodiment.

FIG. 13 illustrates a state when the pusher 251 in the state of FIG. 11J rises to the upper position UR set above the placing rod 231. As described above, when the arrangement mode is changed for the substrates W held by the pusher 251, the pusher 251 is raised. This is because it is necessary to transfer a part of the substrate W held by the pusher 251 to the HVC posture converter 23 in order to change the arrangement mode.

Figure 14A:
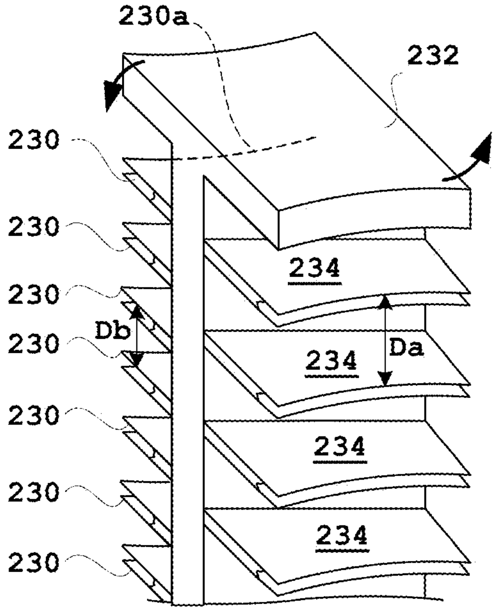
FIG. 14A is a schematic diagram illustrating a batch assembly according to the embodiment.
Figure 14B:
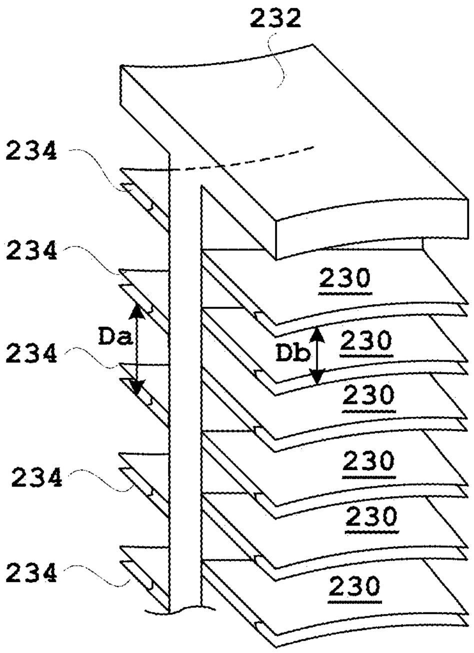
FIG. 14B is a schematic diagram illustrating a batch assembly according to the embodiment.

FIG. 13 also illustrates a state in which the clamping rod 232 in the upright state is half-rotated about a rotation axis parallel to the extending direction thereof. The clamping rod 232 before the half-rotation is configured to clamp the substrate W by the clamping plate 234, but the clamping rod 232 after the half-rotation clamps the substrate W by the clamping plate 230. FIG. 14A and FIG. 14B illustrate a state in which the arrangement pitch of the clamping plates is changed by rotating the clamping rod 232. The clamping rod 232 before the half-rotation can collectively clamp the substrates W arranged at a pitch of 10 mm. The clamping rod 232 after the half-rotation can collectively clamp the substrates W arranged at a pitch of 20/3 mm.

However, since the clamping rod 232 clamps the substrate W in cooperation with the pair of clamping rods 232, the half-rotation operation is executed by the pair of clamping rods 232. The pair of clamping rods 232 before the half-rotation orient the clamping plates 234 to face each other, but the pair of clamping rods 232 after the half-rotation orient the clamping plates 230 to face each other.

Figure 15:
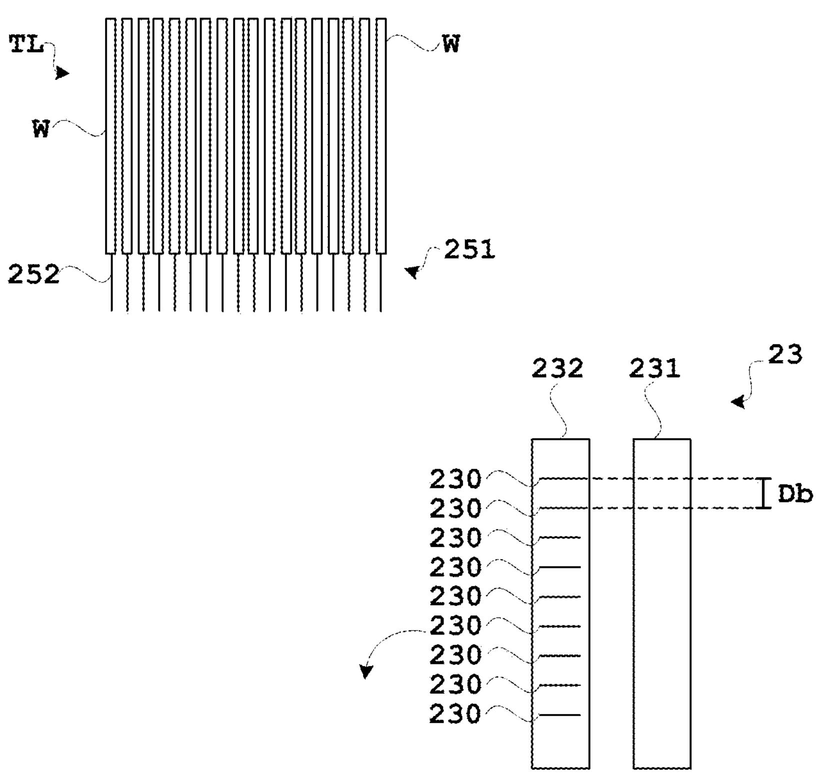
FIG. 15 is a schematic diagram illustrating a batch assembly according to the embodiment.

FIG. 15 illustrates a state in which the HVC posture converter 23 is then operated and the placing rod 231 and the clamping rod 232 in the upright state are rotated by 90°. With this operation, the HVC posture converter 23 is ready to receive the substrates W from the pusher 251.

Figure 16A:
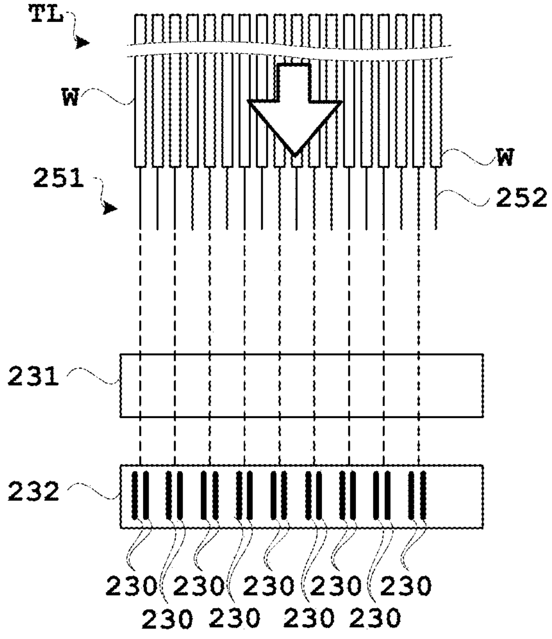
FIGS. 16A to 16B are schematic diagrams each illustrating a batch assembly according to the embodiment.

FIG. 16A illustrates a state in which the pusher 251 at the upper position starts to descend to transfer the substrates W to the HVC posture converter 23. As can be seen with reference to the drawing, the arrangement pitch of the clamping plates 230 is longer than the arrangement pitch of the substrates W in the temporary batch lot TL. Therefore, the number of the clamping plates 230 is smaller than the number of the substrates W in the temporary batch lot TL.

Figure 16B:
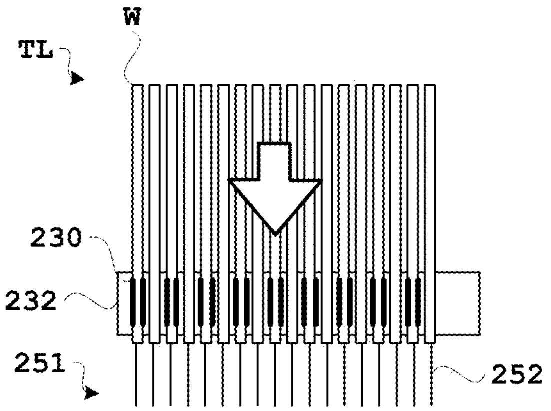

FIG. 16B illustrates a state where the temporary batch lot TL held by the pusher 251 is transferred to the clamping rod 232. The clamping rod 232 cannot clamp all the substrates W of the temporary batch lot TL. This is because the number of the clamping plates 230 is smaller than the number of the substrates W in the temporary batch lot TL. As a result, the half of the substrates W constituting the temporary batch lot TL is clamped by the corresponding clamping plate 230, and the remaining half is not clamped by the clamping plate 230 and remains held by the pusher 251. FIG. 16B illustrates a state in which the substrates W clamped by the clamping plates 230 and the substrates W held by the pusher 251 are alternately arranged.

The pusher 251 continues to descend even after the substrates W are transferred to the clamping rod 232.

Figure 17A:
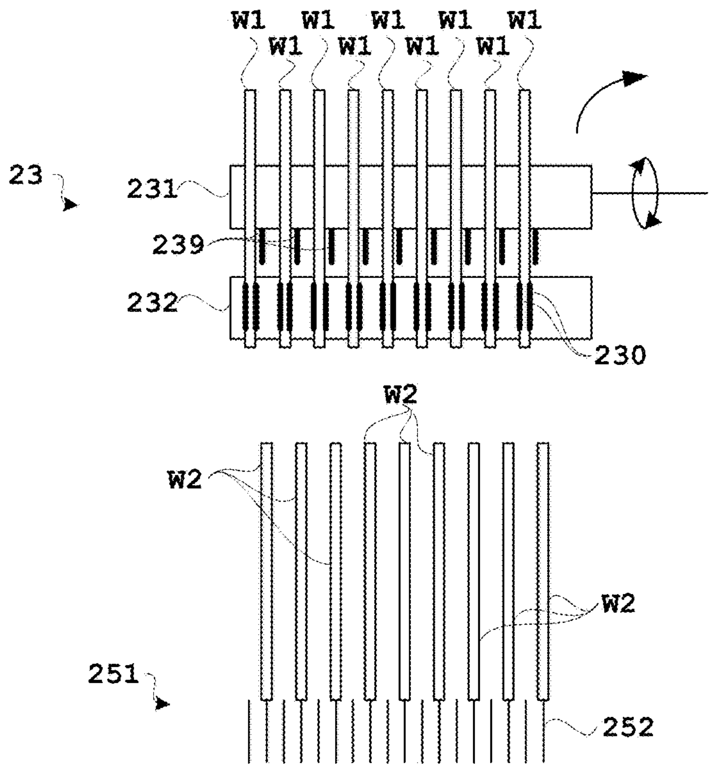
FIG. 17A is a schematic diagram illustrating a batch assembly according to the embodiment.

FIG. 17A illustrates a state after the pusher 251 passes through the clamping rod 232. In this manner, the temporary batch lot TL is dissembled into the first set substrate W1 arranged at a 20/3 mm pitch and the second set substrate W2 arranged at the same 20/3 mm pitch. Assuming that the first set substrate W1 is the first set and the second set substrate W2 is the second set, the temporary batch lot TL is divided into the first set and the second set. The substrate of the first set is clamped by the clamping rod 232, and the substrate in the second set is held by the pusher 251.

FIG. 17A illustrates the rotation of the placing rod 231 about the left-right axis. When the flat plate is inserted into the gap of the first set substrate W1, the arrangement pitch of the first set substrate W1 and the arrangement pitch of the flat plates need to coincide with each other. The arrangement pitch of the first set substrate W1 is 20/3 mm, and the arrangement pitch of the flat plates 233 described in FIG. 5 is 10 mm. Therefore, when the flat plate 233 is positioned in the gap of the first set substrate W1, the arrangement pitches do not match each other, and the first set substrate W1 and the flat plate 233 collide with each other.

Assuming such a situation, the placing rod 231 of the present example has an arrangement in which the flat plates 239 are arranged at a pitch of 20/3 mm. When the placing rod 231 is rotated to position the flat plate 239 in the gap of the first set substrate W1, the first set substrate W1 and the flat plate 239 do not collide with each other because the arrangement pitches are matched with each other.

This rotating operation is executed with the placing rod 231 in the contracted state. When the same operation is performed on the placing rod 231 in the extended state, the flat plate 239 collides with the first set substrate W1. This is because the position in the left-right direction Y of the flat plate 239 arranged on the placing rod 231 in the extended state coincides with the position in the left-right direction Y of the first set substrate W1 clamped by the clamping rod 232. Therefore, when the flat plate 239 is inserted into the gap of the first set substrate W1, it is necessary to shift the flat plate 239 in the left-right direction Y with respect to the first set substrate W1.

When the placing rod 231 rotates and the flat plate 239 is inserted into the gap of the first set substrate W1, the placing rod 231 is extended this time. In this way, the flat plate 239 abuts on the back surface of the first set substrate W1, and the substrate W is reliably held by the placing rod 231 even if the placing rod 231 is brought into the upright state.

Figure 17B:
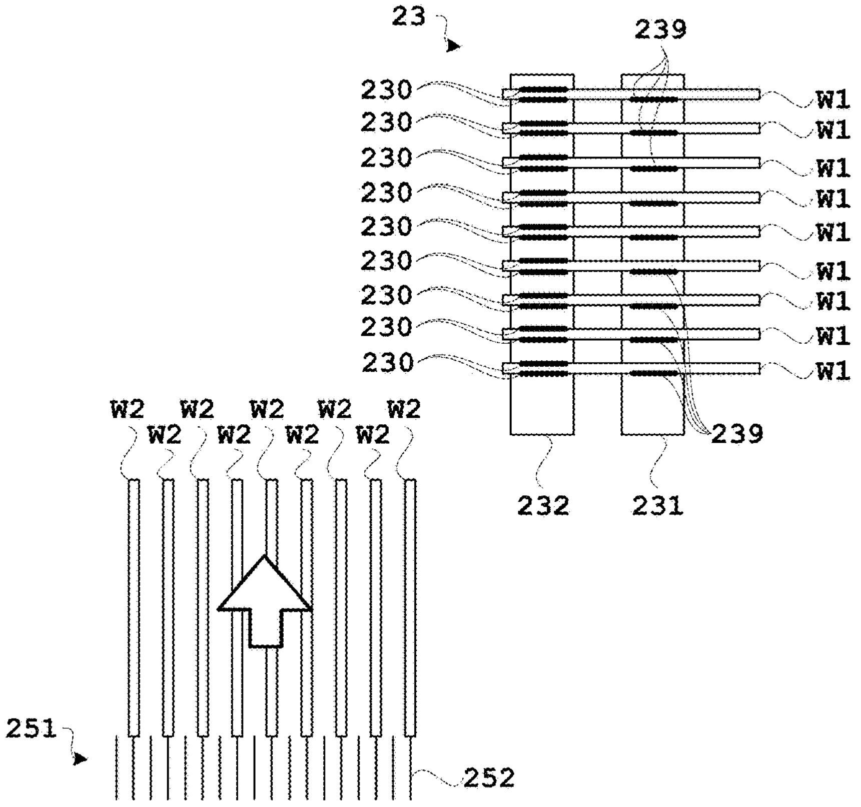
FIG. 17B is a schematic diagram illustrating a batch assembly according to the embodiment.
Figure 17C:
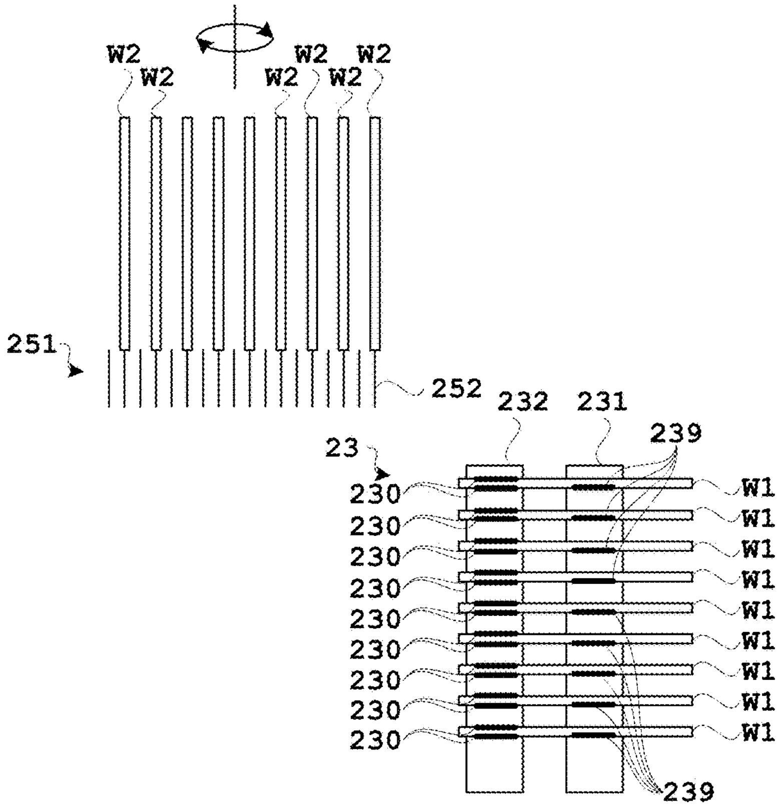
FIG. 17C is a schematic diagram illustrating a batch assembly according to the embodiment.

FIG. 17B illustrates a state when the HVC posture converter 23 is operated and the placing rod 231 is in the upright state. At this time, since the clamping rod 232 merely clamps the end portion of the first set substrate W1, the first set substrate W1 in the horizontal posture cannot be held only by this. In this respect, since the flat plate 239 of the placing rod 231 can hold the center of the first set substrate W1, the first set substrate W1 in the horizontal posture is reliably held by the pair of placing rods 231 even when the clamping rod 232 is in the upright state.

FIG. 17B illustrates a state in which the pusher 251 rises. The placing rod 231 and the clamping rod 232 in the HVC posture converter 23 are already rotated by 90° and retracted from the pusher 251. Therefore, even if the pusher 251 rises, the pusher does not collide with the clamping rod 232 and the placing rod 231.

FIG. 17 C illustrates a state in which the pusher 251 is half-rotated at the upper position of the HVC posture converter 23. The pusher 251 rotates about the vertical axis by the operation of the pusher rotation mechanism 253. By performing such an operation, the second set substrate W2 oriented in one direction is all oriented in the opposite direction.

Figure 17D:
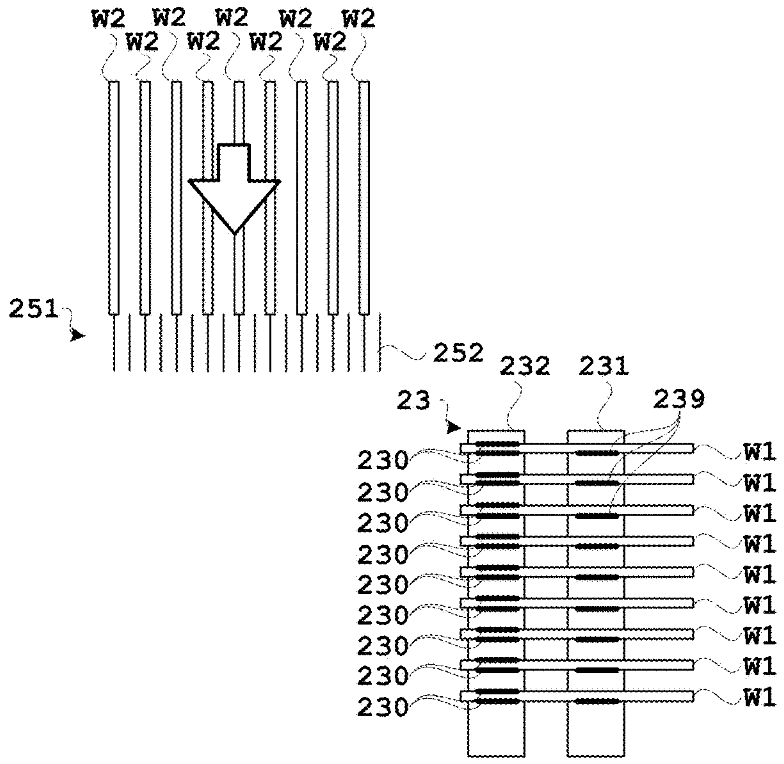
FIG. 17D is a schematic diagram illustrating a batch assembly according to the embodiment.

FIG. 17D illustrates a state in which the pusher 251 is lowered after the half-rotation operation. The pusher 251 passes through the arrangement of the first set substrate W1 and stops at a position below the first set substrate W1.

Figure 17E:
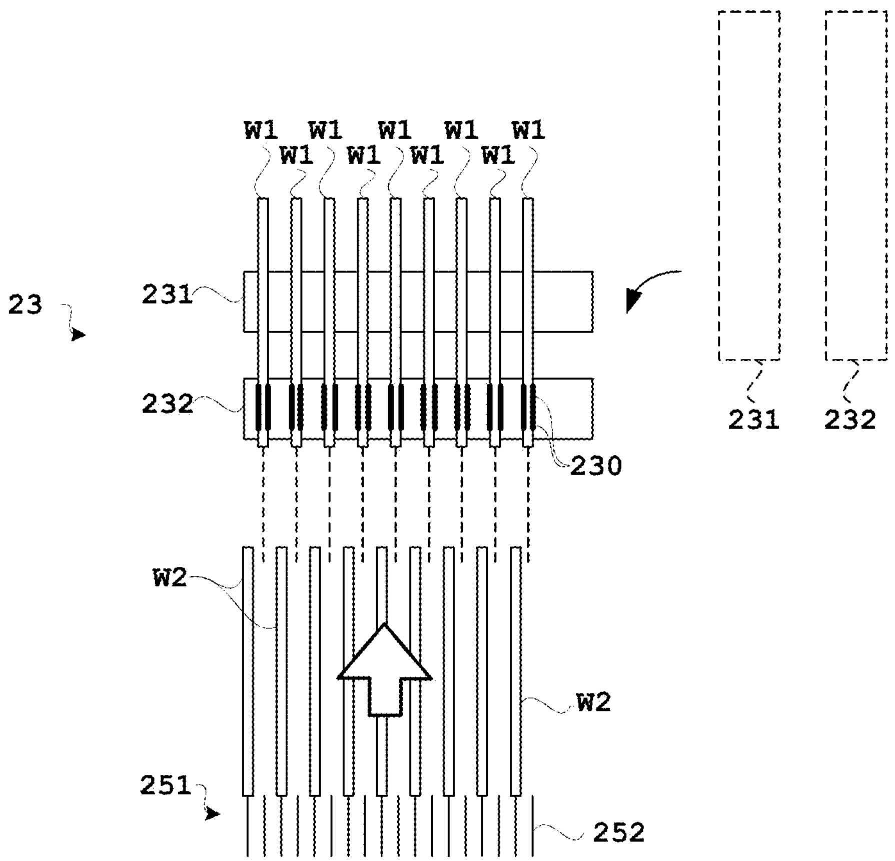
FIG. 17E is a schematic diagram illustrating a batch assembly according to the embodiment.

FIG. 17E illustrates a state in which the HVC posture converter 23 is then operated and the placing rod 231 and the clamping rod 232 in the upright state are rotated by 90°. With this operation, the HVC posture converter 23 is ready to transfer the first set substrate W1 to the pusher 251. Before the state of FIG. 17E is obtained, the placing rod 231 performs the contraction operation and the rotation operation described with reference to FIGS. 11D and 11E, and the clamping plate 230 is retracted from the gap of the first set substrate W1. If such an operation is performed in advance, the clamping plate 230 does not collide with the pusher 251 appearing from below and the second set substrate W2 supported by the pusher 251.

FIG. 17E also illustrates a state where the pusher 251 starts to rise after the placing rod 231 and the clamping rod 232 are tilted.

Figure 17F:
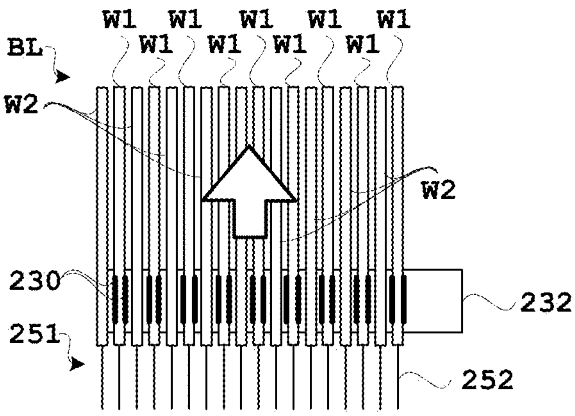
FIG. 17F is a schematic diagrams each illustrating a batch assembly according to the embodiment.

FIG. 17F illustrates a state in which the pusher 251 receives the first set substrate W1 from the clamping rod 232. At this time, the batch lot BL in which the first set substrate W1 oriented in one direction and the second set substrate W2 oriented in the opposite direction are alternately arranged is generated in the pusher 251.

The pusher 251 continues to rise even after the first set substrate W1 is acquired from the clamping rod 232.

Figure 17G:
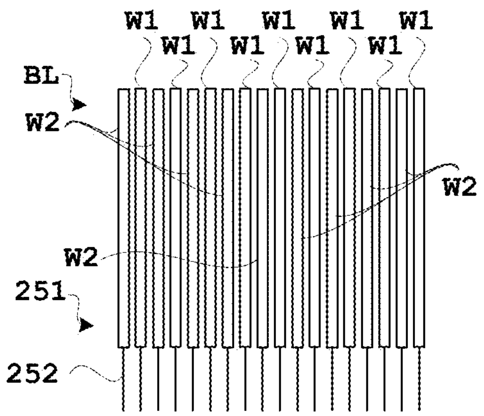
FIG. 17G is a schematic diagrams each illustrating a batch assembly according to the embodiment.

FIG. 17G illustrates a state after the pusher 251 extracts the first set substrate W1 from the clamping rod 232. In this way, the batch lot BL of the present example is generated.

The generation of the batch lot BL is performed in the following procedure. First, the substrates W constituting the temporary batch lot TL are divided into a first set and a second set such that two substrates W facing each other form different sets. Then, the temporary batch lot TL is disassembled by moving the first set and the second set relative to each other in a direction (vertical direction Z) orthogonal to the arrangement direction (left-right direction Y) of the substrates. Then, the second set substrate W2 is half-rotated. As a result, the initial direction of the second set substrate W2 is oriented in the opposite direction. Finally, the first set substrate W1 and the second set substrate W2 are combined such that the first set substrate W1 oriented in one direction and the second set substrate W2 oriented in the opposite direction are alternately arranged. The batch lot BL is obtained by arranging the substrates W by such a face-to-face method.

The number of substrates W constituting the batch lot BL is 75, which is the same as the number of substrates W related to the temporary batch lot TL. Therefore, the number of substrates constituting the batch lot BL is 3 times that of the initial substrate group.

Figure 18:
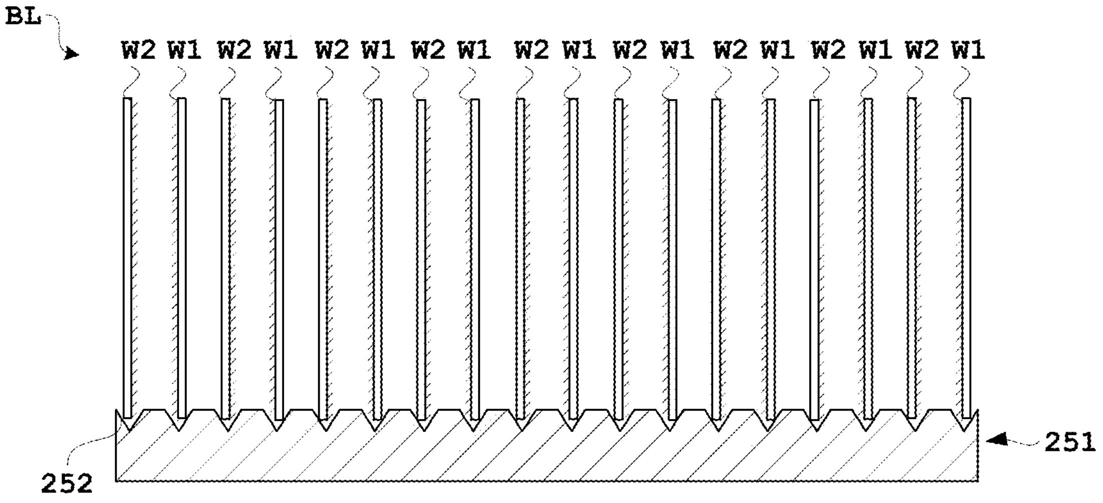
FIG. 18 is a schematic diagram illustrating a batch assembly according to the embodiment.

FIG. 18 illustrates the batch lot BL. In the batch lot BL, the first set substrate W1 oriented in one direction and the second set substrate W2 oriented in the opposite direction are repeatedly arranged at a pitch of 10/3 mm. Therefore, the batch lot BL is formed by arranging the substrates W by a face-to-face method.

6. Holding Batch Lot in Transfer Block

The transfer block 5 has two sites capable of holding the batch lot BL. One of them is the pusher 251. The pusher 251 can reciprocate between an initial position where the substrate W can be transferred to and from the HVC posture converter 23 and a transfer position PP where the batch lot BL can be transferred to the advance/retract conveyance mechanism WTR. This reciprocating movement is realized by the pusher shift mechanism 254.

The transfer block 5 includes a lot support 33 as a portion capable of holding the batch lot BL separately from the pusher 251. The lot support 33 serves as a batch lot holding part for temporarily retracting the batch lot BL when congestion of the batch lot BL occurs between the transfer block 5 and the processing block 6.

7. Processing Block

Hereinafter, the configuration of the processing block 6 described with reference to FIG. 1 will be described. The processing block 6 is adjacent to the transfer block 5. The processing block 6 performs batch processing on the above-described batch lot BL. The processing block 6 is divided into a batch processing region R1 and the collective conveyance region R2 arranged in the width direction (Y direction). Each region extends in the front-back direction (X direction). Specifically, the batch processing region R1 is disposed inside the processing block 6. The collective conveyance region R2 is adjacent to the batch processing region R1 and is disposed on the leftmost side of the processing block 6.

The batch processing region R1 in the processing block 6 is a rectangular region extending in the front-back direction (X direction). One end side (front side) of the batch processing region R1 is adjacent to the transfer block 5. The other end side of the batch processing region R1 extends in a direction away from the transfer block 5 (backward side). When the batch lot BL is conveyed from the transfer block 5 to the processing block 6, the advance/retract conveyance mechanism WTR included in the processing block 6 is used.

The advance/retract conveyance mechanism WTR collectively conveys a plurality of substrates W in a vertical posture among the transfer block 5, the batch processing units BPU1 to BPU6, and a batch drying chamber DC. The advance/retract conveyance mechanism WTR can hold the batch lot BL including the substrates W arranged at a pitch of 10/3 mm.

The batch processing region R1 includes a batch-type processing unit that performs batch-type processing. Specifically, in the batch processing region R1, the batch drying chamber DC for collectively drying a plurality of substrates W, and a plurality of batch processing units BPU1 to BPU6 for collectively immersing the plurality of substrates W in a direction in which the batch processing region R1 extends are arranged. The batch processing units BPU1 to BPU6 collectively immerse a plurality of substrates in a vertical posture. The arrangement of the batch drying chamber DC and the batch processing units BPU1 to BPU6 will be specifically described. The batch drying chamber DC is adjacent to the transfer block 5 from the rear. The first batch processing unit BPU1 is adjacent to the batch drying chamber DC from the rear. The second batch processing unit BPU2 is adjacent to the first batch processing unit BPU1 from the rear. The third batch processing unit BPU3 is adjacent to the second batch processing unit BPU2 from the rear. The fourth batch processing unit BPU4 is adjacent to the third batch processing unit BPU3 from the rear. The fifth batch processing unit BPU5 is adjacent to the fourth batch processing unit BPU4 from the rear. The sixth batch processing unit BPU6 is adjacent to the fifth batch processing unit BPU5 from the rear. Therefore, the batch drying chamber DC, the first batch processing unit BPU1, the second batch processing unit BPU2, the third batch processing unit BPU3, the fourth batch processing unit BPU4, the fifth batch processing unit BPU5, and the sixth batch processing unit BPU6 are arranged so as to be separated from the transfer block 5 in this order.

Each of the batch processing units BPU1 to BPU6 includes a batch processing tank capable of holding liquid. The batch processing tank is a liquid tank that holds a chemical solution or pure water. The chemical solution may be an acidic aqueous solution, for example, a phosphoric acid aqueous solution. In the present specification, the chemical solution and pure water are collectively referred to as a processing liquid. A batch processing tank for holding a chemical solution is referred to as batch chemical solution processing tanks CHB2 to CHB6, and a batch processing tank for holding pure water is referred to as batch rinse processing tank ONB.

Specifically, the second batch processing unit BPU2 includes a batch chemical solution processing tank CHB2 that collectively performs chemical solution processing on the batch lot BL, and a lifter LF2 that raises and lowers the batch lot BL between the substrate transfer position and the chemical solution processing position (see FIG. 2). The substrate transfer position is a position set above the batch chemical solution processing tank CHB2 accessible by the advance/retract conveyance mechanism WTR, and the chemical solution processing position is a position set in the tank of the batch chemical solution processing tank CHB2 capable of immersing the batch lot BL in the chemical solution. The batch chemical solution processing tank CHB2 performs acid processing on the batch lot BL. The acid processing may be a phosphoric acid processing, but may be a processing using another acid. In the phosphoric acid processing, etching processing is performed on a plurality of substrates W constituting the batch lot BL. In the etching processing, for example, the nitride film on the front surface of the substrate W is chemically etched.

The lifter LF2 can hold the batch lot BL including the substrates W arranged at a 10/3 mm pitch. Like the lifter LF2, lifters provided in other processing tanks can also hold the batch lot BL. The batch drying chamber DC can house the batch lot BL.

The batch chemical solution processing tank CHB2 houses an acid solution such as a phosphoric acid solution. The batch chemical solution processing tank CHB2 is provided with a lifter LF2 for moving the batch lot BL up and down. The lifter LF2 moves up and down in the vertical direction (Z direction). Specifically, the lifter LF2 moves up and down between a processing position corresponding to the inside of the batch chemical solution processing tank CHB2 and a delivery position corresponding to the upper side of the batch chemical solution processing tank CHB2. The lifter LF2 holds the batch lot BL including the substrate W in a vertical posture. The lifter LF2 delivers the batch lot BL to and from the advance/retract conveyance mechanism WTR at the delivery position. When the lifter LF2 descends from the delivery position to the processing position in a state of holding the batch lot BL, the entire region of the substrate W is located below the liquid level of the chemical solution. When the lifter LF2 rises from the processing position to the delivery position in a state of holding the batch lot BL, the entire region of the substrate W is located on the liquid level of the chemical solution. The lifter LF2 can collectively immerse the batch lot BL in the batch processing tank. At this time, the lifter LF2 descends from the delivery position to the processing position.

Specifically, the third batch processing unit BPU3 includes a batch chemical solution processing tank CHB3 and a lifter LF3 that raises and lowers the batch lot BL between the substrate transfer position and the chemical solution processing position. The batch chemical solution processing tank CHB3 has the same configuration as the batch chemical solution processing tank CHB2 described above. That is, the batch chemical solution processing tank CHB3 houses the chemical solution described above, and is provided with the lifter LF3. The batch chemical solution processing tank CHB3 performs the same processing as the batch chemical solution processing tank CHB2 on the batch lot BL. The substrate processing apparatus 1 of the present example includes a plurality of processing tanks capable of performing the same chemical solution processing. This is because the phosphoric acid processing takes more time than other processing. The phosphoric acid processing requires a long time (for example, 60 minutes). Therefore, in the apparatus of the present example, the acid processing can be concurrently performed by a plurality of batch chemical solution processing tanks.

The fourth batch processing unit BPU4 to the sixth batch processing unit BPU6 have the same configuration as the second batch processing unit BPU2 and the third batch processing unit BPU3. That is, the fourth batch processing unit BPU4 includes the batch chemical solution processing tank CHB4 and the lifter LF4 that raises and lowers the batch lot BL between the substrate transfer position and the chemical solution processing position. Similarly, the fifth batch processing unit BPU5 includes a batch chemical solution processing tank CHB5 and a lifter LF5 that raises and lowers the batch lot BL between the substrate transfer position and the chemical solution processing position. The sixth batch processing unit BPU6 includes a batch chemical solution processing tank CHB6 and a lifter LF6 that raises and lowers the batch lot BL between the substrate transfer position and the chemical solution processing position. Therefore, the batch lot BL is acid-processed in any one of the batch chemical solution processing tank CHB2 to the batch chemical solution processing tank CHB6. When the chemical solution processing is concurrently performed by the five processing units in this manner, the throughput of the apparatus is increased.

Specifically, the first batch processing unit BPU1 includes a batch rinse processing tank ONB that houses a rinse solution, and a lifter LF1 that raises and lowers the batch lot BL between the substrate transfer position and the rinse position. The substrate transfer position is a position set above the batch rinse processing tank ONB accessible by the advance/retract conveyance mechanism WTR, and the rinse position is a position set in a tank of the batch rinse processing tank ONB capable of immersing the batch lot BL in the rinse solution. The batch rinse processing tank ONB has the same configuration as the batch chemical solution processing tank CHB2 described above. That is, the batch rinse processing tank ONB houses the rinse solution and is provided with the lifter LF1. Unlike other processing tanks, the batch rinse processing tank ONB houses pure water, and is provided for the purpose of cleaning the chemical solution attached to the plurality of substrates W. In the batch rinse processing tank ONB, when the specific resistance of the pure water in the tank increases to a predetermined value, the cleaning processing ends.

As described above, the batch rinse processing tank ONB in the present embodiment is located closer to the transfer block 5 than the batch chemical solution processing tanks CHB2 to CHB6. With this configuration, the mechanisms constituting the transfer block 5 and the batch chemical solution processing tanks CHB2 to CHB6 are separated as much as possible, and the pusher mechanism 25 and the like are not adversely affected by an acid such as phosphoric acid. In addition, by arranging the transfer block 5 and the batch drying chamber DC close to each other, the batch lot BL for which the rinse processing has been finished is conveyed by a short distance and immediately returned to the transfer block 5.

8. Collective Conveyance Region in Processing Block

The collective conveyance region R2 in the processing block 6 is a rectangular region extending in the front-back direction (X direction). The collective conveyance region R2 is provided along the outer edge of the batch processing region R1, and has one end side extending to the transfer block 5 and the other end side extending in a direction away from the transfer block 5.

The collective conveyance region R2 is provided with an advance/retract conveyance mechanism WTR that collectively conveys a plurality of substrates W. The advance/retract conveyance mechanism WTR collectively conveys a plurality of substrates W (specifically, batch lots BL) between the substrate transfer position PP defined in the transfer block 5, the lot support 33, the batch drying chamber DC, and each of the batch processing units BPU1 to BPU6. The advance/retract conveyance mechanism WTR is configured to be able to reciprocate in the front-back direction (X direction) across the transfer block 5 and the processing block 6. The advance/retract conveyance mechanism WTR can also enter the substrate transfer position PP and the lot support 33 in the transfer block 5 in addition to the collective conveyance region R2 in the processing block 6.

The advance/retract conveyance mechanism WTR includes a pair of chucks 29 for conveying the batch lot BL. The pair of chucks 29 can be changed to a closed state in which they are close to each other and an open state in which they are separated from each other. The chuck 29 is a member extending in the Y direction in which grooves for gripping the substrate W are arranged at a pitch of 10/3 mm. The pair of chucks 29 is closed to receive the plurality of substrates W constituting the batch lot BL. Then, the pair of chucks 29 is opened to transfer the plurality of substrates W constituting the batch lot BL to another member (the lifter LF1 or the like). The advance/retract conveyance mechanism WTR transfers the batch lot BL between the substrate transfer position PP in the transfer block 5 and the lot support 33. In addition, the advance/retract conveyance mechanism WTR transfers the batch lot BL to and from each of the lifters LF1 to LF6 belonging to the batch processing units BPU1 to BPU6 in the processing block 6 and the batch drying chamber DC.

In the collective conveyance region R2, a guide rail 31 extending in the X direction for guiding the advance/retract conveyance mechanism WTR is provided. The advance/retract conveyance mechanism WTR can advance and retract in the X direction along the guide rail 31. Therefore, the guide rail 31 extends from the processing block 6 to the transfer block 5. More specifically, the guide rail 31 faces the substrate transfer position PP in the transfer block 5 from the Y direction, and faces the sixth batch processing unit BPU6 in the processing block 6 from the Y direction. Besides, the guide rail 31 faces the lot support 33 in the transfer block 5, the batch drying chamber DC in the processing block 6, and the first batch processing unit BPU1 to the sixth batch processing unit BPU6 from the Y direction.

9. Other Configurations in Processing Block

The batch drying chamber DC is disposed at a position sandwiched between the first batch processing unit BPU1 and the transfer block 5. The batch drying chamber DC has a drying chamber that accommodates the batch lot BL in which the substrates W in the vertical posture are arranged. The drying chamber includes an inert gas supply nozzle that supplies an inert gas into the chamber, and a vapor supply nozzle that supplies vapor of an organic solvent into the tank. The batch drying chamber DC first supplies an inert gas to the batch lot BL supported in the chamber to replace the atmosphere in the chamber with the inert gas. Then, pressure reduction in the chamber is started. In a state where the inside of the chamber is depressurized, vapor of the organic solvent is supplied into the chamber. The organic solvent is discharged to the outside of the chamber together with moisture adhering to the substrate W. In this way, the batch drying chamber DC performs the drying of the batch lot BL. The inert gas at this time may be, for example, nitrogen, and the organic solvent may be, for example, isopropyl alcohol (IPA).

The carrier placement shelf 13*a*, the batch drying chamber DC, and the batch processing units BPU1 to BPU6 in the substrate processing apparatus 1 are arranged in the front-back direction. That is, the carrier placement shelf 13*a* is arranged in front, and the batch drying chamber DC is arranged behind the carrier placement shelf 13*a*. The batch processing units BPU1 to BPU6 are disposed further behind the batch processing units BPU1 to BPU6. In the substrate processing apparatus 1 of the present embodiment, the layout in the apparatus is optimized so that the moving distance of the advance/retract conveyance mechanism WTR decreases.

10. Controller

FIG. 1 can be referred to for the controller 131 included in the substrate processing apparatus 1. Although not illustrated in FIG. 1, the controller 131 is provided with a corresponding storage unit. The controller 131 includes, for example, a central processing unit (CPU). A specific configuration of the controller is not limited, and for example, each controller may be configured by a single processor, or each controller may be configured by an individual processor.

Examples of the control related to the controller 131 include control related to the carrier conveyance mechanism 11, the handling robot HTR, the HVC posture converter 23, the pusher mechanism 25, the advance/retract conveyance mechanism WTR, the batch processing units BPU1 to BPU6, and the batch drying chamber DC.

11. Flow of Substrate Processing

Figure 19:
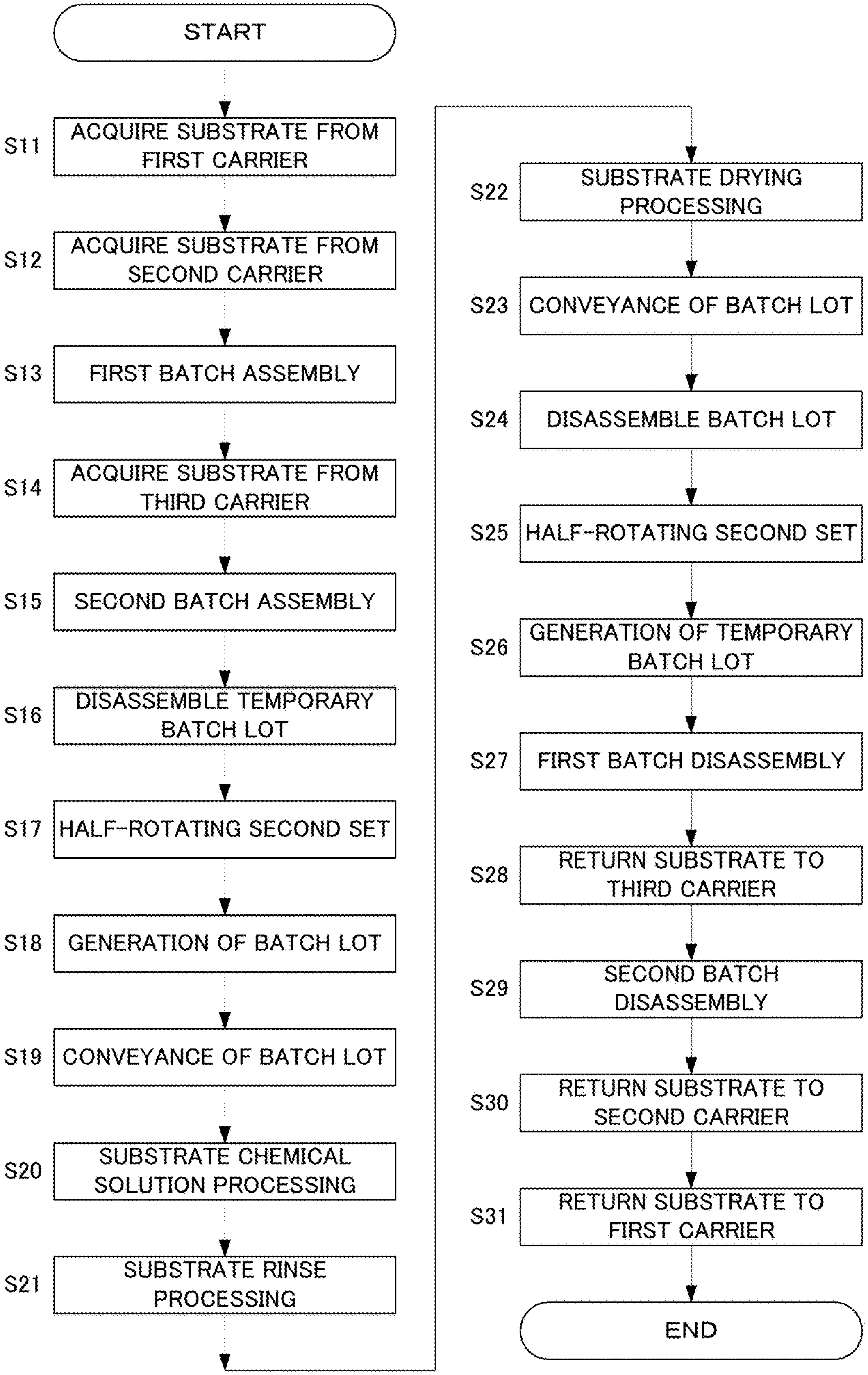
FIG. 19 is a flowchart illustrating a flow of a substrate according to the embodiment.

Hereinafter, the flow of the substrate processing of the present example will be described with reference to the flowcharts of FIG. 19.

Step S11: The substrates W arranged at a pitch of 10 mm conveyed from the first carrier C1 by the handling robot HTR are acquired by the pusher 251 after posture conversion. Step S11 corresponds to the substrate group acquisition process of the present invention.

Step S12: The handling robot HTR acquires the substrates W from the second carrier C2 and transfers the substrates W to the HVC posture converter 23. Step S12 corresponds to the first process of the present invention.

Step S13: The substrates W arranged at a pitch of 10 mm acquired from the second carrier C2 are transferred to the pusher 251 after posture conversion. Since the substrates W related to the first carrier C1 have already been arranged in the pusher 251, the substrates W related to the first carrier C1 and the substrates W related to the second carrier C2 are batch assembled in the pusher 251. Step S13 corresponds to the first assembly process of the present invention. Between step S12 and step S13, the above-described second process is executed.

Step S14: The handling robot HTR acquires the substrates W from the third carrier C3 and transfers the substrates W to the HVC posture converter 23. Step S14 corresponds to the first process of the present invention.

Step S15: The substrates W arranged at a pitch of 10 mm acquired from the third carrier C3 are transferred to the pusher 251 after posture conversion. Since the substrates W related to the first carrier C1 and the substrates W related to the second carrier C2 are already arranged in the pusher 251, the substrate array related to the first carrier C1 and the second carrier C2 and the substrates W related to the third carrier C3 are batch assembled in the pusher 251. In this way, the temporary batch lot TL is generated. Step S15 corresponds to the second assembly process of the present invention. Between step S14 and step S15, the above-described second process is executed.

Step S16: The substrates W constituting the temporary batch lot TL are divided into a first set and a second set. The pusher 251 holding the temporary batch lot TL transfers the first set substrate W1 related to the first set to the clamping rod 232 and separates the first set substrate W1 from the second set substrate W2 related to the second set. Step S16 corresponds to a disassembly process of the present invention.

Step S17: A half-rotation of the second set substrate W2 is executed. By this operation, the second set substrate W2 that has been oriented in one direction is oriented in the opposite direction. Step S17 corresponds to a half-rotation process of the present invention.

Step S18: The pusher 251 moves up and down to acquire the first set substrate W1 from the clamping rod 232. In the pusher 251, clamping grooves 252 for clamping the second set substrate W2 and empty clamping grooves 252 are alternately arranged. When the first set substrate W1 each is inserted into the corresponding empty clamping groove 252, the generation of the batch lot BL is completed. Step S18 corresponds to a rearrangement process of the present invention.

Step S19: The generated batch lot BL is conveyed from the transfer block 5 to the processing block 6 by the advance/retract conveyance mechanism WTR.

Step S20: The batch lot BL is subjected to a chemical solution processing. Step S20 corresponds to a processing process of the present invention.

Step S21: The batch lot BL is subjected to a rinse processing.

Step S22: The batch lot BL is subjected to a drying processing.

In this way, the substrate processing is realized in batch lot units.

Step S23: The batch lot BL subjected to the substrate processing is conveyed from the processing block 6 to the transfer block 5 by the advance/retract conveyance mechanism WTR.

Step S24: The pusher 251 holds the second set substrate W2 and transfers the first set substrate W1 to the clamping rod 232.

Step S25: A half-rotation of the second set substrate W2 is executed. By this operation, the second set substrate W2 that has been oriented in the opposite direction is oriented in one direction.

Step S26: The pusher 251 acquires the first set substrate W1 from the clamping rod 232. In the pusher 251, clamping grooves 252 for clamping the second set substrate W2 and empty clamping grooves 252 are alternately arranged. When the first set substrate W1 each is inserted into the corresponding empty clamping groove 252, the generation of the temporary batch lot TL is completed.

Step S27: In the pusher 251, the substrates W related to the third carrier C3 are arranged at a pitch of 10 mm. The pusher 251 moves up and down to transfer the substrates W related to the third carrier C3 to the clamping rod 232. In this manner, the temporary batch lot TL is disassembled.

Step S28: The substrates W transferred across the clamping rod 232 is returned to the third carrier C3 by the handling robot HTR after posture conversion.

Step S29: In the pusher 251, the substrates W related to the second carrier C2 are arranged at a pitch of 10 mm. The pusher 251 moves up and down to transfer the substrates W related to the second carrier C2 to the clamping rod 232. In this manner, the disassembly of the temporary batch lot TL proceeds.

Step S30: The substrates W transferred across the clamping rod 232 is returned to the second carrier C2 by the handling robot HTR after posture conversion.

Step S31: In the pusher 251, the substrates W related to the first carrier C1 are arranged at a pitch of 10 mm. The pusher 251 moves up and down to transfer the substrates W related to the first carrier C1 to the clamping rod 232. The transferred substrates W are returned to first carrier C1 by the handling robot HTR after posture conversion.

12. Effects of Present Example

According to the present example, the temporary batch lot TL in which the substrates W are oriented in the same direction is formed. Then, the substrates W are divided into a first set and a second set such that two substrates W facing each other among the substrates W constituting the temporary batch lot TL form different sets, and the second set is half-rotated. Then, by combining the first set and the second set, the substrates W oriented in one direction and the substrates W oriented in the opposite direction are alternately arranged to generate a batch lot BL. With this configuration, the substrates W can be arranged face-to-face while the arrangement pitch of the substrates W is narrower than that in the conventional method.

According to the present example, the number of the substrates W constituting the batch lot BL is 3 times the number of the substrate groups in step S11. With this configuration, no extra substrate W is generated in the substrate group when the batch BL lot is formed. Since the substrate group is not divided into two batch lots BL, it is possible to reliably match the history of substrate processing in the substrates constituting the substrate group.

According to the present example, a first process of collectively acquiring each substrate W from a carrier C that houses substrates W that are in a horizontal posture and arranged at a predetermined interval in a vertical direction, and a second process of collectively converting the posture of each substrate W from a horizontal posture to a vertical posture are provided, and the first process and the second process are performed before step S13 and step S15. With this configuration, it is possible to provide a substrate processing method executed by receiving the first set of the first set substrate W1 or the second set of the second set substrate W2 arranged in one direction from the carrier C.

According to the present example, the predetermined interval is equal to the arrangement pitch of the substrates W housed in the carrier C. With this configuration, it is easy to change the pitch of the substrates W.

According to the present example, the distance from the first position P1 to the second position P2 is ⅓ of the arrangement pitch of the substrates W housed in the carrier C. With this configuration, the pitch of the substrate arrangement to be generated can be ½ or less of the arrangement pitch of the substrates W housed in the carrier.

According to the present example, the first position P1 and the second position P2 equally divide the predetermined interval into three. With this configuration, the substrates W can be arranged more orderly.

13. Modified Example

The present invention is not limited to the configuration of the embodiment, and modifications can be made as follows.

<Modification 1>

In the substrate processing method of the embodiment, the substrates W are acquired from the carrier C that houses the odd number of substrates W, but the present invention is not limited to this configuration. The substrate may be acquired from the carrier C that houses the even number of substrates W. With such a configuration, the number of substrates W constituting the temporary batch lot TL is an even number. Then, the number of the first set substrate W1 and the number of the second set substrate W2 are the same. With this configuration, the temporary batch lot TL is disassembled such that the substrates W positioned at one end of the temporary batch lot TL and the substrates W positioned at the other end of the temporary batch lot TL are divided into different sets. With such a configuration, the orientation of the substrates W constituting the batch lot BL can be made desired. That is, according to the present modification, since the orientation of the substrates W at one end and the orientation of the substrates W at the other end in the batch lot BL can be made different, the arrangement of the substrates W can be made face-to-face more reliably.

<Modification 2>

Although the temporary batch lot TL in the substrate processing method of the embodiment includes the odd number of substrates W, the number of the first set substrate W1 and the number of the second set substrate W2 can be the same by adding the dummy wafer to the temporary batch lot TL. With this configuration, since the orientation of the substrates W at one end and the orientation of the substrates W at the other end in the batch lot BL can be made different, the arrangement of the substrates W can be made face-to-face more reliably.

What is claimed is:

1. A substrate processing method for collectively processing a plurality of substrates having directions defined by a front surface and a back surface, the substrate processing method comprising:

a substrate group acquisition process of acquiring a substrate group in which substrates oriented in one direction are arranged at a predetermined interval;

a first assembly process of positioning a first substrate at a first position among the first position and a second position that divide the predetermined interval in the substrate group into three by combining a first arrangement in which the first substrate oriented in the one direction is arranged at the predetermined interval with the substrate group;

a second assembly process of forming a temporary batch lot by positioning a second substrate at the second position by combining a second arrangement in which the second substrate oriented in the one direction is arranged at the predetermined interval with the substrate group;

a disassembly process of disassembling the temporary batch lot by dividing the substrates into a first set and a second set such that two substrates facing each other among substrates constituting the temporary batch lot form different sets, and moving the first set and the second set relative to each other in a direction orthogonal to an arrangement direction of the substrates;

a half-rotation process of orienting the substrates constituting the second set in a direction opposite to the one direction by half-rotating the second set;

a rearrangement process of combining the first set and the second set to generate a batch lot such that the substrates oriented in the one direction and the substrates oriented in the opposite direction are alternately arranged; and a processing process of immersing the batch lot in a processing liquid.

2. The substrate processing method according to claim 1, wherein in the disassembly process, the temporary batch lot is disassembled such that the substrates positioned at one end of the temporary batch lot and the substrates positioned at the other end of the temporary batch lot are divided into different sets.

3. The substrate processing method according to claim 1, wherein the number of substrates constituting the batch lot is 3 times the number of the substrate group in the substrate group acquisition process.

4. The substrate processing method according to claim 1, comprising a first process of collectively acquiring each substrate from a carrier that houses substrates that are in a horizontal posture and arranged at a predetermined interval in a vertical direction, and a second process of collectively converting the posture of each substrate from a horizontal posture to a vertical posture, wherein the first process and the second process are performed before each assembly process.

5. The substrate processing method according to claim 1, wherein the predetermined interval is equally divided into three by the first position and the second position.

6. The substrate processing method according to claim 4, wherein the predetermined interval is equal to an arrangement pitch of the substrates housed in the carrier.

7. The substrate processing method according to claim 4, wherein a distance from the first position to the second position is ⅓ times an arrangement pitch of substrates housed in the carrier.

* * * * *